United States Patent
Juengling

(10) Patent No.: US 7,482,229 B2
(45) Date of Patent: Jan. 27, 2009

(54) DRAM CELLS WITH VERTICAL TRANSISTORS

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 126 days.

(21) Appl. No.: 11/490,294

(22) Filed: Jul. 20, 2006

(65) Prior Publication Data
US 2006/0258109 A1 Nov. 16, 2006

Related U.S. Application Data

(62) Division of application No. 10/933,062, filed on Sep. 1, 2004, now Pat. No. 7,442,976.

(51) Int. Cl.
*H01L 21/336* (2006.01)
(52) U.S. Cl. .............................. 438/268; 257/E21.652; 257/E21.655
(58) Field of Classification Search ................ 438/268; 257/E21.652, E21.655
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,648,937 A | 3/1987 | Ogura et al. | |
| 4,776,922 A | 10/1988 | Bhattacharyya et al. | |
| 4,838,991 A | 6/1989 | Cote et al. | |
| 5,013,680 A | 5/1991 | Lowrey et al. | |
| 5,315,142 A | 5/1994 | Acovic et al. | |
| 5,319,753 A | 6/1994 | MacKenna et al. | |

(Continued)

FOREIGN PATENT DOCUMENTS

DE 44 08 764 A1 9/1994

(Continued)

OTHER PUBLICATIONS

Scholesser et al., "Highly Scalable Sub-50nm Vertical Double Gate Trench Dram Cell", Memory Development Center, Infineon Tech., 2004, 4 pages.

(Continued)

*Primary Examiner*—Lex Malsawma
(74) *Attorney, Agent, or Firm*—Knobbe, Martens, Olson & Bear, LLP

(57) ABSTRACT

The invention includes a semiconductor structure having U-shaped transistors formed by etching a semiconductor substrate. In an embodiment, the source/drain regions of the transistors are provided at the tops of pairs of pillars defined by crossing trenches in the substrate. One pillar is connected to the other pillar in the pair by a ridge that extends above the surrounding trenches. The ridge and lower portions of the pillars define U-shaped channels on opposite sides of the U-shaped structure, facing a gate structure in the trenches on those opposite sides, forming a two sided surround transistor. Optionally, the space between the pillars of a pair is also filled with gate electrode material to define a three-sided surround gate transistor. One of the source/drain regions of each pair extending to a digit line and the other extending to a memory storage device, such as a capacitor. The invention also includes methods of forming semiconductor structures.

27 Claims, 28 Drawing Sheets

U.S. PATENT DOCUMENTS

| | | | |
|---|---|---|---|
| 5,328,810 A | 7/1994 | Lowrey et al. | |
| 5,398,205 A | 3/1995 | Yamaguchi | |
| 5,408,116 A | 4/1995 | Tanaka et al. | |
| 5,502,320 A | 3/1996 | Yamada | |
| 5,514,885 A | 5/1996 | Myrick | |
| 5,583,065 A | 12/1996 | Miwa | |
| 5,679,591 A | 10/1997 | Lin et al. | |
| 5,905,285 A | 5/1999 | Gardner et al. | |
| 5,981,333 A | 11/1999 | Parekh et al. | |
| 6,004,862 A | 12/1999 | Kim et al. | |
| 6,071,789 A | 6/2000 | Yang et al. | |
| 6,140,172 A | 10/2000 | Parekh | |
| 6,150,688 A | 11/2000 | Maeda et al. | |
| 6,229,169 B1 * | 5/2001 | Hofmann et al. | 257/296 |
| 6,291,334 B1 | 9/2001 | Somekh | |
| 6,297,554 B1 | 10/2001 | Lin | |
| 6,548,396 B2 | 4/2003 | Naik et al. | |
| 6,551,878 B2 | 4/2003 | Clampitt et al. | |
| 6,573,030 B1 | 6/2003 | Fairbairn et al. | |
| 6,627,933 B2 | 9/2003 | Juengling | |
| 6,693,026 B2 | 2/2004 | Kim | |
| 6,707,092 B2 | 3/2004 | Sasaki | |
| 6,709,807 B2 | 3/2004 | Hallock et al. | |
| 6,713,392 B1 | 3/2004 | Ngo et al. | |
| 6,734,063 B2 | 5/2004 | Willer et al. | |
| 6,734,107 B2 | 5/2004 | Lai et al. | |
| 6,737,333 B2 | 5/2004 | Chen et al. | |
| 6,777,725 B2 | 8/2004 | Willer et al. | |
| 6,882,006 B2 | 4/2005 | Maeda et al. | |
| 6,900,521 B2 * | 5/2005 | Forbes et al. | 257/616 |
| 6,936,507 B2 | 8/2005 | Tang et al. | |
| 7,098,105 B2 | 8/2006 | Juengling | |
| 7,109,544 B2 | 9/2006 | Schloesser et al. | |
| 2002/0042198 A1 | 4/2002 | Bjarnason et al. | |
| 2002/0125536 A1 | 9/2002 | Iwasa et al. | |
| 2002/0130686 A1 | 9/2002 | Forbes | |
| 2002/0135029 A1 | 9/2002 | Ping et al. | |
| 2003/0008461 A1 | 1/2003 | Forbes et al. | |
| 2003/0040186 A1 | 2/2003 | Juengling et al. | |
| 2003/0042542 A1 | 3/2003 | Maegawa et al. | |
| 2003/0044722 A1 | 3/2003 | Hsu et al. | |
| 2003/0085422 A1 | 5/2003 | Amali et al. | |
| 2003/0164513 A1 | 9/2003 | Ping et al. | |
| 2003/0203564 A1 | 10/2003 | McQueen et al. | |
| 2003/0207207 A1 | 11/2003 | Li | |
| 2003/0218199 A1 | 11/2003 | Forbes et al. | |
| 2003/0230234 A1 | 12/2003 | Nam et al. | |
| 2004/0000534 A1 | 1/2004 | Lipinski | |
| 2004/0036095 A1 | 2/2004 | Brown et al. | |
| 2005/0048714 A1 | 3/2005 | Noble | |
| 2005/0151206 A1 | 7/2005 | Schwerin | |
| 2005/0207264 A1 | 9/2005 | Hsieh et al. | |
| 2005/0277249 A1 | 12/2005 | Juengling | |
| 2006/0022248 A1 | 2/2006 | Fischer et al. | |
| 2006/0028859 A1 | 2/2006 | Forbes | |
| 2006/0046407 A1 | 3/2006 | Juengling | |
| 2006/0278911 A1 | 12/2006 | Eppich | |

FOREIGN PATENT DOCUMENTS

| | | |
|---|---|---|
| DE | 199 28 781 C1 | 7/2000 |
| WO | WO 01/01489 A1 | 1/2001 |
| WO | WO 02/099864 A1 | 12/2002 |
| WO | WO 2004/073044 | 8/2004 |
| WO | WO 2005/119741 A3 | 12/2005 |

OTHER PUBLICATIONS

Bhave et al., "Developer-soluble Gap fill materials for patterning metal trenches in Via-first Dual Damascene process," preprint of Proceedings of SPIE: Advances in Resist Technology and Processing XXI, vol. 5376, John L. Sturtevant, editor, 2004, 8 pages.

Chung et al., "Pattern multiplication method and the uniformity of nanoscale multiple lines*," J. Vac.Sci. Technol. B21(4), Jul./Aug. 2003, pp. 1491-1495.

Chung et al., "Nanoscale Multi-Line Patterning Using Sidewall Structure," Jpn., J.App.. Phys. vol. 41 (2002) Pt. 1, No. 6B, pp. 4410-4414.

Joubert et al., Nanometer scale linewidth control during etching of polysilicon gates in high-density plasmas, Microelectronic Engineering 69 (2003), pp. 350-357.

Oehrlein et al., "Pattern transfer into low dielectric materials by high-density plasma etching," Solid State Tech., May 2000, 8 pages.

Ran-Hong Yan et al., *Scaling the Si MOSFET: From Bulk to SOI to Bulk;* IEEE Transactions on Electron Devices, vol. 39 No. 7 Jul. 1992.

Sakao, M. et al., *A Straight-Line-Trench Isolation and Trench-Gate Transistor (SLIT) Cell for Giga-bit DRAMs;* IEEE VLSI Technology Symposium May 17-19, 1993 Kyoto, Japan, pp. 19-20.

Office Action received in U.S. Appl. No. 11/367,020, dated Jan. 29, 2008.

* cited by examiner

US 7,482,229 B2

DRAM CELLS WITH VERTICAL TRANSISTORS

REFERENCE TO RELATED APPLICATIONS

This application is a divisional of U.S. application Ser. No. 10/933,062, titled DRAM Cells with Vertical Transistors, filed on Sep. 1, 2004, now U.S. Pat. No. 7,442,976 the entirety of which is hereby incorporated herein by reference. This application is related to U.S. application Ser. No. 10/855,429, titled Methods for Forming Semiconductor Structures, filed on May 26, 2004, U.S. application Ser. No. 11/406,455, titled Semiconductor Structures And Memory Device Constructions, filed on Apr. 18, 2006, and U.S. application Ser. No. 11/201,824, titled Semiconductor Structures And Memory Device Constructions, filed on Aug. 10, 2005, the entirety of which are hereby incorporated herein by reference.

BACKGROUND OF THE INVENTION

1. Field of the Invention

The present invention relates to semiconductor structures, memory device constructions, and methods for forming semiconductor structures.

2. Description of the Related Art

Integrated circuit designers often desire to increase the level of integration or density of elements within an integrated circuit by reducing the size of the individual elements and by reducing the separation distance between neighboring elements. One example of a common integrated circuit element is a transistor, which can be found in many devices, such as memory circuits, processors, and the like. A typical integrated circuit transistor comprises a source, a drain, and a gate formed at the surface of the substrate.

A relatively common semiconductor device is a memory device, with a dynamic random access memory (DRAM) cell being an exemplary memory device. A DRAM cell comprises a transistor and a memory storage structure, with a typical memory storage structure being a capacitor. Modern applications for semiconductor devices can utilize vast numbers of DRAM unit cells.

It would therefore be desirable to develop new methods for fabricating semiconductor devices. It would also be desirable to develop new semiconductor device constructions that can be utilized in semiconductor applications, such as DRAM structures.

SUMMARY OF THE INVENTION

In one embodiment, the invention encompasses a method of forming a semiconductor structure. A lattice, having horizontal segments and vertical segments, is etched into a semiconductor substrate, such as a silicon wafer or a portion of bulk silicon. In a further embodiment, an epitaxial layer is grown on the semiconductor substrate prior to forming the lattice. Etching the lattice into the semiconductor substrate forms repeating regions of silicon spaced from one another by segments of the lattice. The repeating regions form an array of silicon pillars having a first pitch along a first axis and a second pitch along a second axis. The second axis is substantially orthogonal to the first axis. The second pitch is approximately twice as big as the first pitch. Pairs of silicon pillars form U-shaped transistors.

A first portion of the horizontal lattice segments is etched to a first depth, and a second portion of the horizontal lattice segments is etched to a second depth. The first depth is less than the second depth. Horizontal lattice segments having the first depth alternate with horizontal lattice segments having the second depth. In an embodiment, the first portion of horizontal lattice segments are filled with a first material, and the second portion of horizontal lattice segments are filled with a second material. Each pillar in the U-shaped transistor is separated from the other pillar in the U-shaped transistor by the first material and one U-shaped transistor is separated from another U-shaped transistor by the second material. Preferably, the first material and the second material are an oxide-containing material. In another embodiment, the first material is a nitride-containing material and the second material is an oxide-containing material.

The vertical lattice segments are etched to a third depth. Preferably, the third depth is greater than the first depth and less than the second depth. In an embodiment, the vertical lattice segments are filled with insulators and conductors forming the gates of the DRAM transistors.

In one embodiment, the invention encompasses a semiconductor structure. The structure includes semiconductor substrate and a gate line lattice formed into the semiconductor substrate. The lattice defines an array of non-gate line regions spaced from one another by segments of the lattice. The array has a first pitch along a first axis and a second pitch along a second axis substantially orthogonal to the first axis. The second pitch is about twice as big as the first pitch. The non-gate line regions comprise vertically extending source/drain regions.

In another embodiment, the invention encompasses a memory device construction. The construction includes a semiconductor substrate and a gate line etched into the semiconductor substrate. The construction further includes a first vertically extending source/drain region and a second vertically extending source/drain region, both regions formed from the substrate, and at least partially surrounded by the gate line. The source/drain regions are gatedly connected to one another through the gate line. A memory storage device is electrically connected to the first source/drain region. A digit line is electrically connected to the second source/drain region.

In an aspect of the invention, a method for forming a transistor for an integrated circuit comprises etching a semiconductor substrate to form a U-shaped silicon pillar pair and etched regions surrounding the U-shaped silicon pillar pair, where the silicon pillar pair comprises a first pillar and a second pillar. The method further comprises forming a first source/drain region in the first pillar, and forming a second source/drain region in the second pillar. The method further comprises forming a gate line in at least a portion of the etched regions, where the gate line at least partially surrounds the first and second pillars, and where the first source/drain region, the second source/drain region and at least a portion of the gate line form a U-shaped transistor.

In another aspect, a method for forming a semiconductor device comprises etching a first set of trenches to a first depth into a semiconductor substrate. The method further comprises etching a second set of trenches to a second depth into the semiconductor substrate, where the first set of trenches is substantially parallel to the second set of trenches, and where the first set of trenches and the second set of trenches are alternately spaced from one another within the semiconductor substrate. The method further comprises etching a third set of trenches to a third depth into the semiconductor substrate, where the third set of trenches is substantially orthogonal to the first set of trenches and to the second set of trenches. The first, second and third sets of trenches define an array of vertically extending pillars, wherein the array of vertically extending pillars comprises vertical source/drain regions. A gate line is formed within at least a portion of the third set of trenches, where the gate line and the vertical source/drain regions form a plurality of transistors in which pairs of the source/drain regions are connected to one another through a transistor channel.

In another aspect, a method for forming a memory array comprises applying a device mask to a semiconductor substrate to form a first pattern of alternating first lines and first gaps on the semiconductor substrate. The method further comprises processing the semiconductor substrate to form a first set of trenches, where the first set of trenches are formed within the semiconductor substrate within at least a portion of the area defined by the first gaps. The method further comprises applying a periphery mask to the semiconductor device after forming the first set of trenches, where the periphery mask protects a periphery adjacent an array region. The method further comprises processing the semiconductor substrate to form a second set of trenches substantially parallel to the first set of trenches, where the second set of trenches are formed within the semiconductor substrate within at least a portion of the array region. The method further comprises applying a wordline mask to the semiconductor device to form a second pattern of alternating second lines and second gaps on the semiconductor substrate after forming the second set of trenches, where the second lines and second gaps intersect with paths of the first lines and first gaps, and processing the semiconductor substrate to form a third set of trenches, where the third set of trenches are formed within the semiconductor substrate within at least a portion of the area defined by the second gaps, and not formed in the protected periphery.

In another aspect, a method for forming a plurality of U-shaped transistors in a semiconductor structure comprises separating first and second pillars of each U-shaped transistor by a plurality of first trenches, and separating each U-shaped transistor from an adjacent U-shaped transistor by a plurality of second trenches that extend deeper into the semiconductor substrate than the first trenches.

In another aspect, an integrated circuit comprises a semiconductor substrate, and first and second U shaped transistors formed within the semiconductor substrate. The first and second U shaped transistors are separated by a first trench that extends deeper into the semiconductor substrate than the first and second U shaped transistors. The semiconductor structure further comprises a second trench that separates the first and second U shaped transistors from third and fourth U shaped transistors, where the second trench extends into the semiconductor substrate and is shallower than the first trench.

In another aspect, a memory cell comprises a semiconductor substrate, and a U shaped transistor formed within the semiconductor substrate. The U-shaped transistor comprises a first pillar and a second pillar, where the first and second pillars are separated by a trench that extends into the semiconductor substrate. The semiconductor structure further comprises a memory storage device connected to the first pillar, and a digit line connected to the second pillar.

In another aspect, a semiconductor structure comprises a plurality of columns of protrusions. Each protrusion includes a source, a drain, and a channel. The semiconductor structure further comprises a plurality of wordline gaps separating the columns from one another. The structure further comprises a plurality of gate lines formed within a portion of the wordline gaps. Each of the gate lines at least partially surrounds one of the columns.

In another aspect, an electronic device comprises at least one U-shaped semiconductor structure having a first U-shaped surface and a second U-shaped surface on opposite sides connected by end-walls. The first and second U-shaped surfaces are substantially parallel. The U-shaped semiconductor structure comprises a first source/drain region and a second source/drain region. The electronic device further comprises a first channel formed along the first U-shaped surface, and a second channel formed along the second U-shaped surface. The electronic device further comprises a gate line facing both U-shaped surfaces, and a field isolation element directly adjacent each end-wall.

In another aspect, a method of forming a memory cell comprises etching a semiconductor substrate to form at least one U-shaped transistor having a first U-shaped surface and a second U-shaped surface. The first and second U-shaped surfaces are substantially parallel. The U-shaped transistor comprises a first source/drain region, a second source/drain region, and a gate line, wherein the first source/drain region and the second source drain region are formed within the semiconductor substrate. The method further comprises forming a first channel within the semiconductor substrate along the first U-shaped surface, and forming a second channel within the semiconductor substrate along the second U-shaped surface. The method further comprises forming the gate line facing each of the first and second channels.

In another aspect, a method of forming a semiconductor structure comprises etching a set of wordline trenches within a semiconductor substrate, and etching a set of deep trenches within a semiconductor substrate. The second set of trenches crosses and creates a grid with the set of wordline trenches, where the set of wordline trenches and the set of deep trenches define a plurality of protrusions within the semiconductor substrate. The method further comprises defining a heavily doped region and a lightly doped region within each protrusion, depositing gate material into the set of wordline trenches, and spacer etching the gate material to define a gate electrode on sidewalls of the protrusion.

In another aspect, a semiconductor structure comprises a semiconductor substrate, and a U-shaped protrusion surrounded by a set of wordline trenches and a set of deep trenches etched into the semiconductor substrate. The U-shaped protrusion comprises a first pillar and a second pillar. The first and second pillars are separated by a shallow trench of a set of shallow trenches that extends into the semiconductor substrate and the first and second pillars are connected by a ridge that extends above the surrounding trenches. The structure further comprises a first source/drain region formed at a top portion of the first pillar, a second source/drain region formed at a top portion of the second pillar, and a gate structure formed in the set of wordline trenches. The ridge and the lower portions of the first and second pillars define U-shaped channels on opposite sides of the U-shaped protrusion. The U-shaped channels face the gate structure formed in the set of wordline trenches.

A lattice and array semiconductor structure constructed above the substrate is disclosed in U.S. patent application Ser. No. 10/855,429, by Werner Juengling, titled Semiconductor Structures, Memory Device Constructions, and Methods for Forming Semiconductor Structures, filed May 26, 2004, the entirety of which is hereby incorporated herein by reference.

For purposes of summarizing the invention, certain aspects, advantages and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention. Throughout the drawings, reference numbers are re-used to indicate correspondence between referenced elements.

DETAILED DESCRIPTION OF THE PREFERRED EMBODIMENTS

A device is disclosed for use in a semiconductor structure such as a memory array, a wordline, a transistor, or any other structure.

Figure 1:
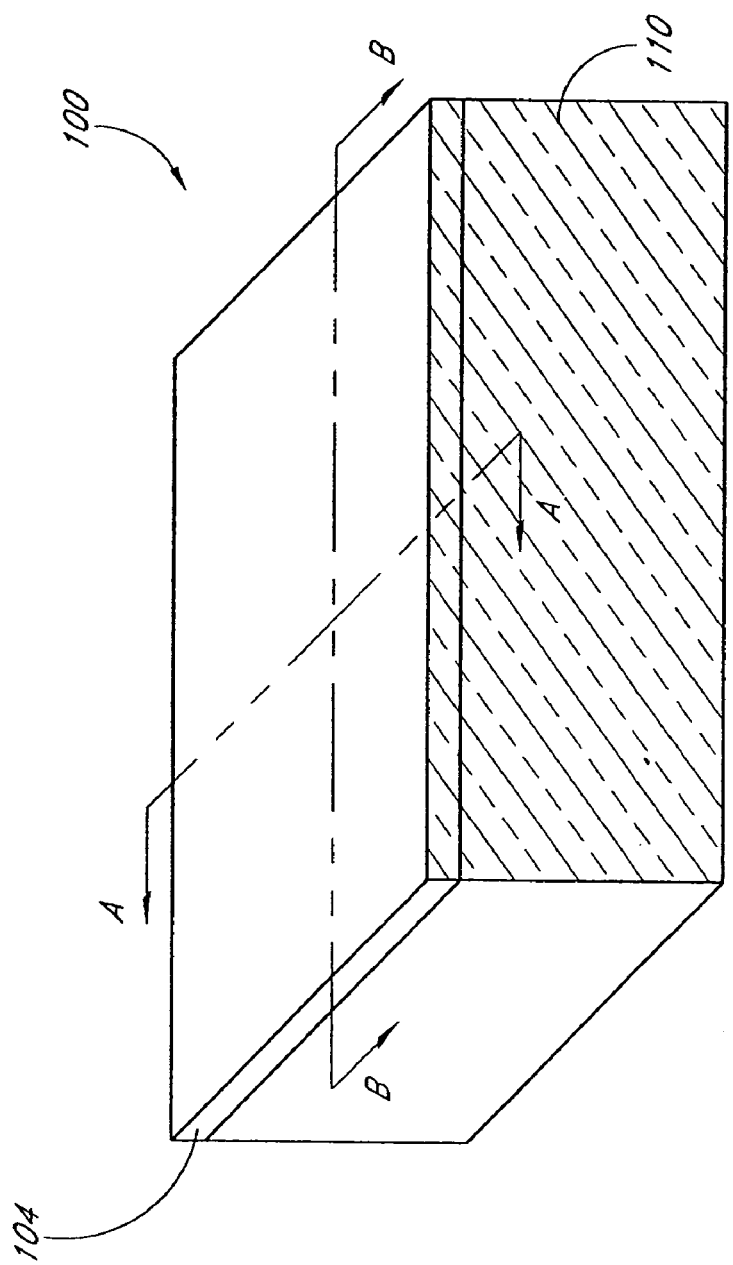
FIG. 1 illustrates a perspective view of an embodiment of a semiconductor device in which an array of transistors can be formed. Views taken along line A-A show a first cross-section of the semiconductor device and views taken along line B-B show a second cross-section of the semiconductor device.

FIG. 1 is a perspective view of an in-process semiconductor device 100 in which a transistor can be formed. In an embodiment, the device 100 comprises a memory array. The device 100 includes a semiconductor substrate 110, which may comprise any of a wide variety of suitable materials. The semiconductor substrate 110 may include semiconductor structures and/or other layers that have been fabricated thereon or any doped silicon platform that is commonly used in the art. While the illustrated semiconductor substrate 110 comprises an intrinsically doped monocrystalline silicon wafer, those of ordinary skill in the art will understand that the semiconductor substrate 110 in other arrangements can comprise other forms of semiconductor layers which include other active or operable portions of semiconductor devices.

In an optional embodiment, an epitaxial layer 104 is grown on the substrate 110. The epitaxial layer 104 is a semiconductor layer (e.g., silicon) grown on the substrate 110 by an epitaxial growth process to extend the wafer's crystal structure. In an embodiment, the epitaxial layer 104 has a thickness preferably within the range of about 2 μm to about 6 μm, more preferably within the range of about 3 μm to about 5 μm. In the case that the epitaxial layer 104 is grown on the substrate 110 prior to the etching steps described below, the epitaxial layer 104 shall be considered part of the substrate 110. As will be understood in view of the description of FIG. 26 below, the epitaxial layer 104 can be heavily doped with a conductivity type opposite to that of the background substrate doping to serve as the active areas of the transistor(s) being formed.

Views taken of a plane formed by slicing the device 100 along line A-A show a first cross-section of the semiconductor device 100 and views taken of a plane formed by slicing the device 100 along line B-B show a second cross-section of the semiconductor device 100 at various stages of the fabrication process described below.

Figure 2:
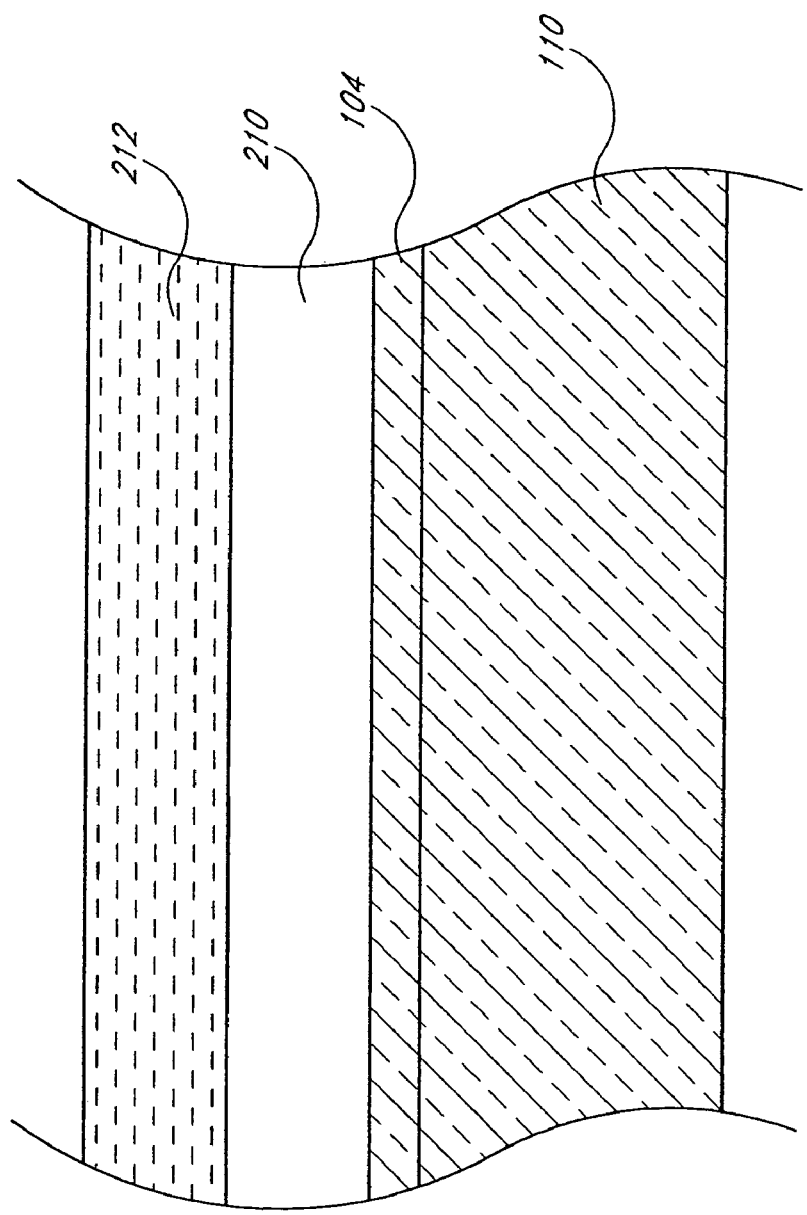
FIG. 2 illustrates a cross-sectional view taken along line A-A of an embodiment of the semiconductor device after the formation of additional semiconductor processing layers.

FIG. 2 illustrates the first cross-section of the device 100. As illustrated in FIG. 2, the semiconductor device 100 further comprises a layer of material 210 formed over the substrate 110 and the optional epitaxial layer 104.

Preferably, the material 210 can be etched selectively with respect to the substrate 110 (silicon) and silicon nitride, and the substrate 110 and the silicon nitride can each be selectively etched with respect to the material 210.

In an embodiment, the material 210 comprises an oxide, such as, for example, silicon dioxide, having a thickness preferably within the range of about 1,000 Å to about 5,000 Å, and more preferably within the range of about 2,000 Å to about 3,000 Å. The material 210 can be deposited using any suitable deposition process, such as, for example, chemical vapor deposition (CVD) or physical vapor deposition (PVD).

The semiconductor device 100 further comprises a layer of material 212 formed over the oxide layer 210 and suitable to be used as a hard mask, in accordance with an embodiment of the invention. In a preferred embodiment, the hard mask 212 comprises amorphous carbon. In other embodiments, the hard mask 212 can comprise tetraethylorthosilicate (TEOS), polycrystalline silicon, $Si_3N_4$, $SiO_3N_4$, SiC, or any other suitable hard mask material. The material 212 can be deposited using any suitable deposition process, such as, for example, chemical vapor deposition (CVD) or physical vapor deposition (PVD). In another embodiment, the material 212 is photoresist used in a photolithography process.

Figure 3:
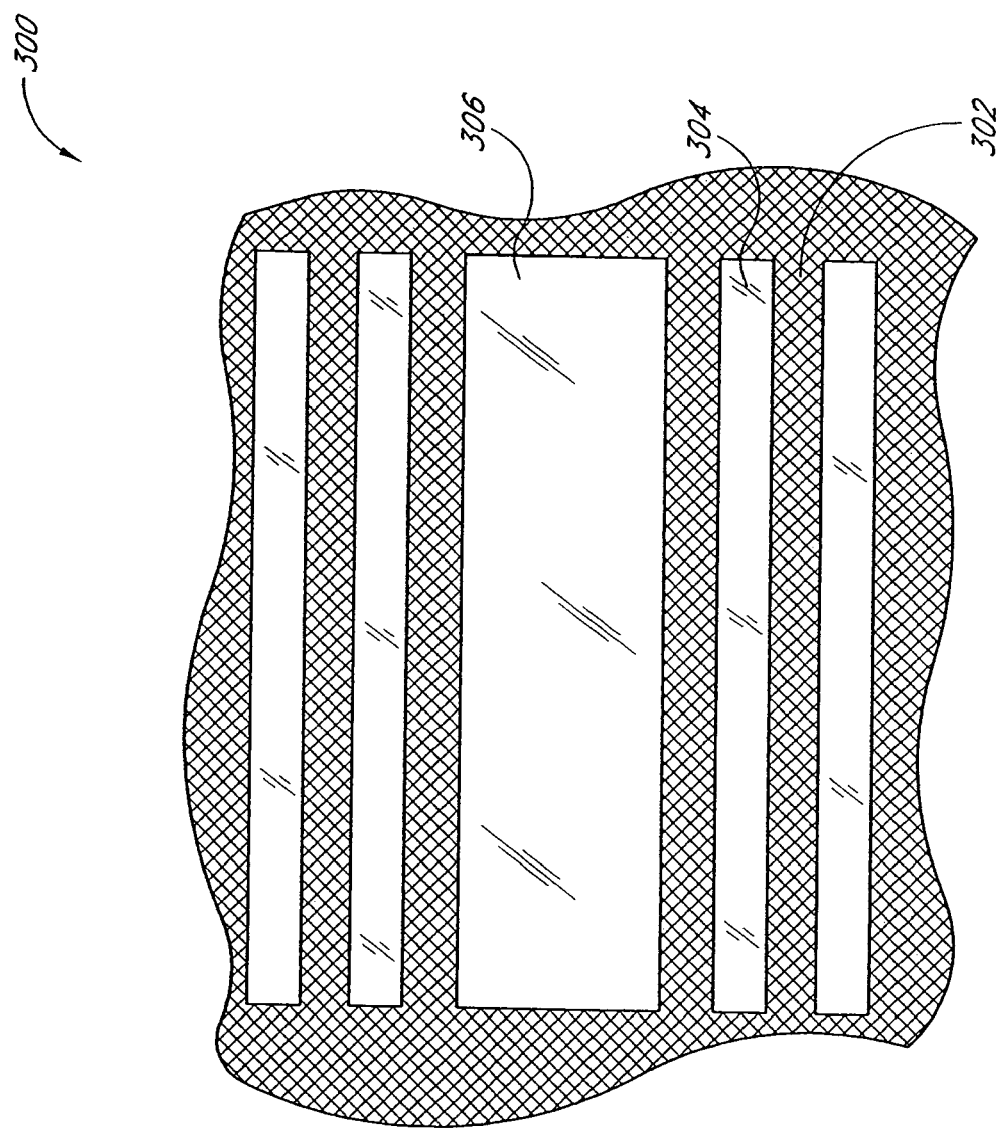
FIG. 3 illustrates a top plan view of an embodiment of a photo mask to be applied to the device illustrated in FIG. 2.

FIG. 3 illustrates a portion of a photo mask 300 to be applied to the device 100 to pattern the hard mask layer 212. The shaded portion of the photo mask 300 represents the area in which the hard mask 212 will remain after applying photolithography and etching techniques, and the unshaded portion represents the area in which the hard mask 212 will be removed. The mask 300 forms a pattern of spaced lines 302 separated from one another by gaps 304. The lines 302 and the gaps 304 extend along a horizontal direction.

In an embodiment, the lines 302 are approximately 1100 Å to approximately 1300 Å wide and the gaps 304 are approximately 700 Å to approximately 900 Å wide.

Preferably, the mask 300 further comprises contact gaps 306, which are wider than gaps 304, and extend in the horizontal direction. In an embodiment, the contact gaps 306 provide an area on the device 100 for placement of a contact, such as, for example, a wordline contact, as will be better understood from the discussion of FIG. 30 below.

Figure 4:
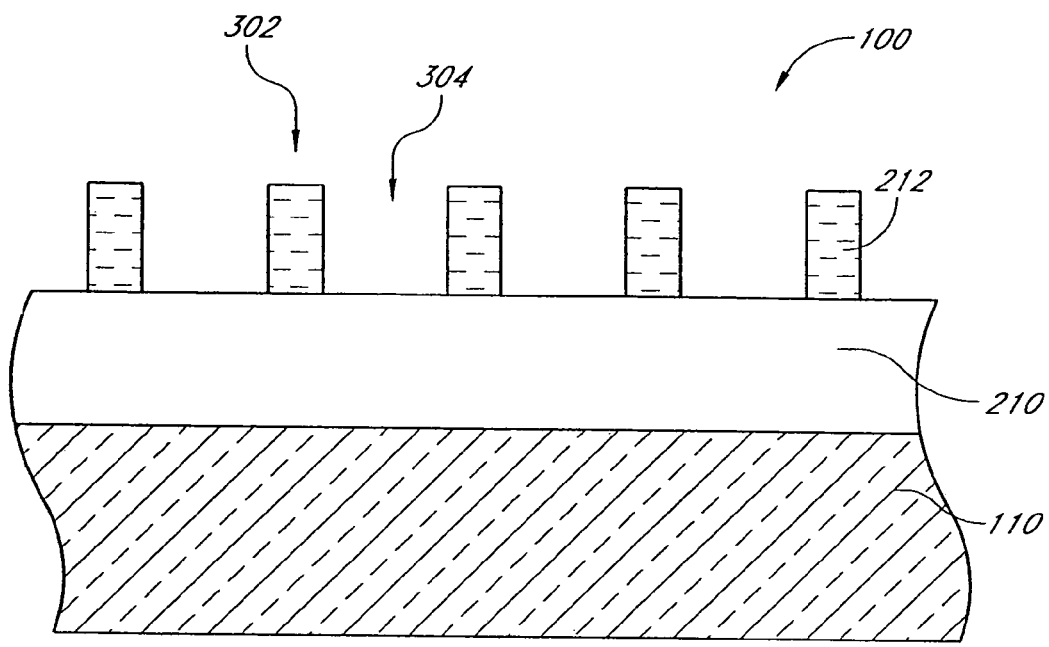
FIG. 4 illustrates a cross-sectional view taken along line A-A of an embodiment of the device of FIG. 2 after the photo mask of FIG. 3 has been applied and transferred to pattern the hard mask layer.

FIG. 4 illustrates the device 100, from the same view as the first cross-section, after applying the photo mask 300 (FIG. 3), and patterning the hard mask 212. As illustrated in FIG. 4, the hard mask 212 remains over areas of the substrate 110 where the mask 300 (FIG. 3) forms lines 302. The hard mask 212 is removed, however, from the area over the substrate 110 where the mask 300 forms gaps 304.

The hard mask 212 can be patterned using well-known photolithography and etching techniques. For example, in some embodiments, photoresist is deposited as a blanket layer over the device 100 and exposed to radiation through a reticle. Following this exposure, the photoresist film is developed to form the photoresist mask 300 (FIG. 3) on the surface of the hard mask 212, and the hard mask 212 is etched through the mask 300 to expose the oxide 210 of the device 110 in the gaps 304. In the illustrated embodiment, features of the hard mask 212 or the prior photo mask 300 are shrunk by isotropic etch, widening the gaps between the features.

Figure 5:
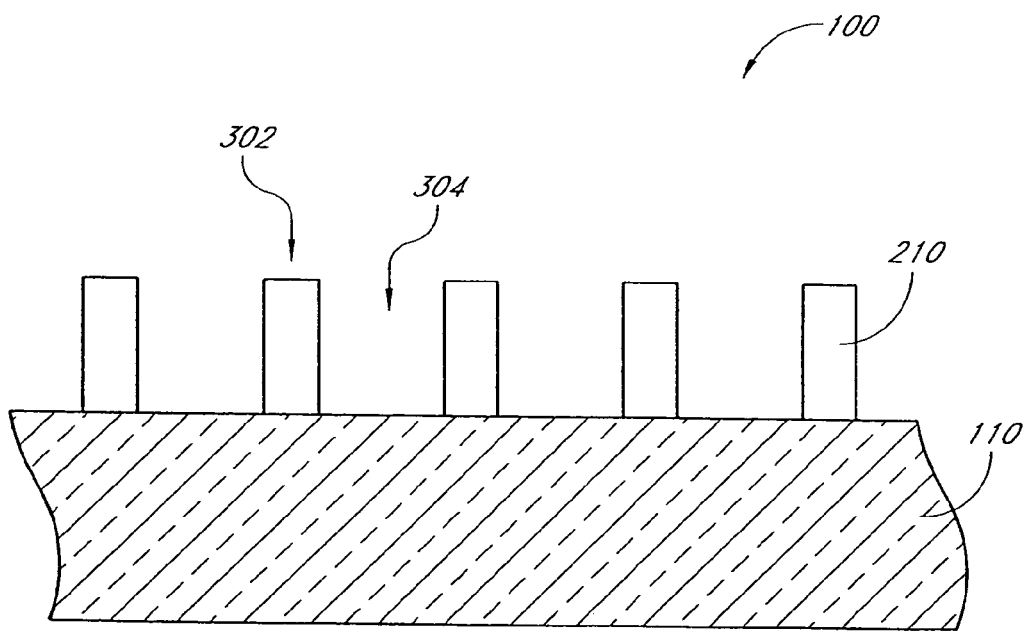
FIG. 5 illustrates a cross-sectional view taken along line A-A of an embodiment of the device of FIG. 4 after transferring the pattern into the oxide layer and removing the hardmask.

FIG. 5 illustrates the device 100 of FIG. 4 from the same view as the first cross-section, after etching the oxide 210 and removing the hard mask 212.

In some embodiments, the oxide 210 is etched using a process such as, for example, ion milling, reactive ion etching (RIE), or chemical etching. If an etching process involving a chemical etchant (including RIE) is selected, any of a variety of well-known etchants can be used, such as for example, $CF_4$.

As illustrated in FIG. 5, the etching process etches the oxide 210 in the areas over the substrate 110 where the mask 300 (FIG. 3) or the hard mask 212 (FIG. 4) forms gaps 304, exposing the substrate 110. The oxide 210 remains over areas of the substrate 110 where the mask 300 (FIG. 3) or the hard mask 212 (FIG. 4) forms lines 302.

Figure 6:
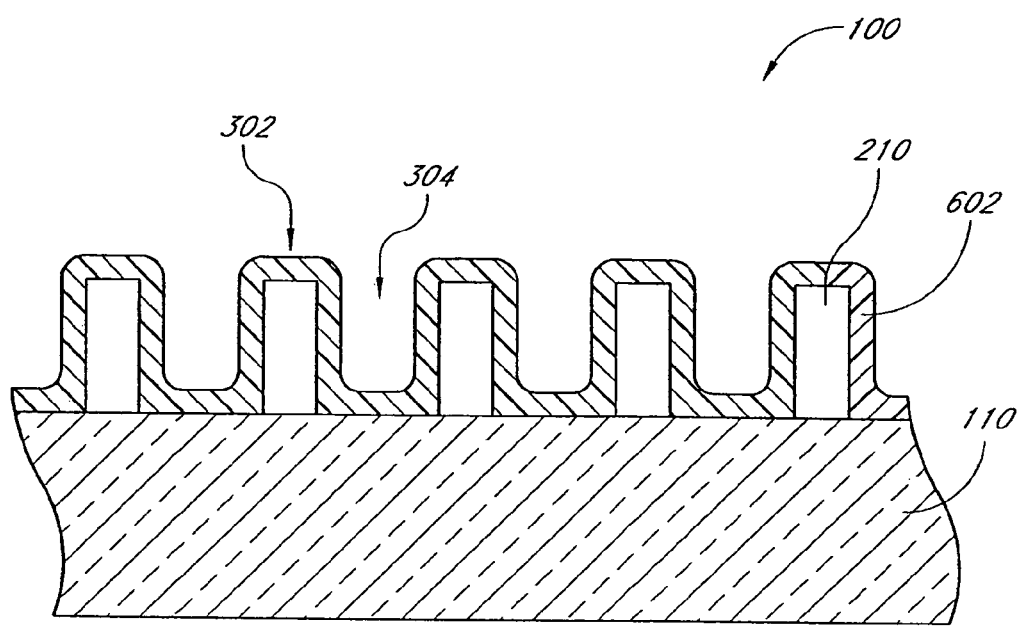
FIG. 6 illustrates a cross-sectional view taken along line A-A of an embodiment of the device of FIG. 5 after deposition of a blanket layer of spacer material.

FIG. 6 illustrates the device 100 of FIG. 5, from the same view as the first cross-section, after forming a layer spacer of material 602 over the oxide 210. Preferably, the spacer material 602 fills approximately 1/20 to 1/3 of the gaps 304. Preferably, the spacer material 602 can be selectively etched with respect to the substrate 110 (silicon) and the oxide 210, and the substrate 110 (silicon) and the oxide 210 can each be selectively etched with respect to the spacer material 602. In an embodiment, the layer of spacer material 602 comprises a nitride-containing material, such as, for example, silicon nitride, having a thickness preferably within the range of about 150 Å to about 250 Å, and more preferably within the range of about 180 Å to about 220 Å. The material 602 can be deposited using any suitable deposition process, such as, for example, chemical vapor deposition (CVD) or physical vapor deposition (PVD).

Figure 7:
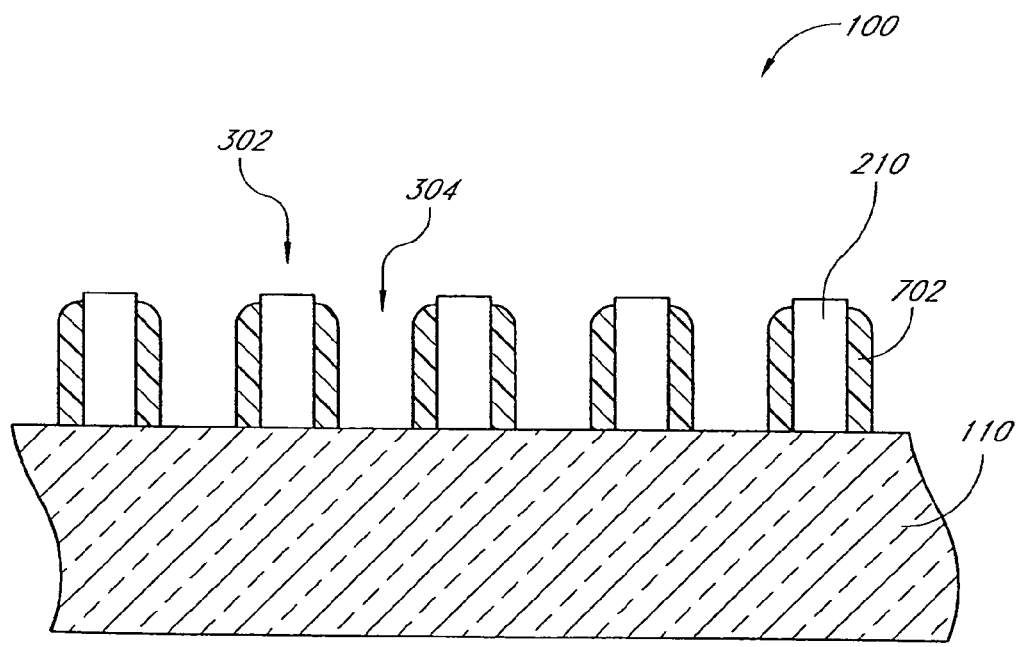
FIG. 7 illustrates a cross-sectional view taken along line A-A of an embodiment of the device of FIG. 6 after a spacer etch.

FIG. 7 illustrates the device 100 of FIG. 6 from the same view as the first cross-section, after forming nitride spacers 702. In an embodiment, an anisotropic etch preferentially removes horizontal surfaces and patterns the nitride layer 602 into the spacers 702 in a well-known spacer etch process. The spacers 702 form within the gaps 304 to narrow the gaps 304. The spacers 702 extend longitudinally in the horizontal direction along lateral interior peripheries of the gaps 304, and have a width preferably within the range of about 150 Å to about 250 Å, and more preferably within the range of about 180 Å to about 220 Å.

Figure 8:
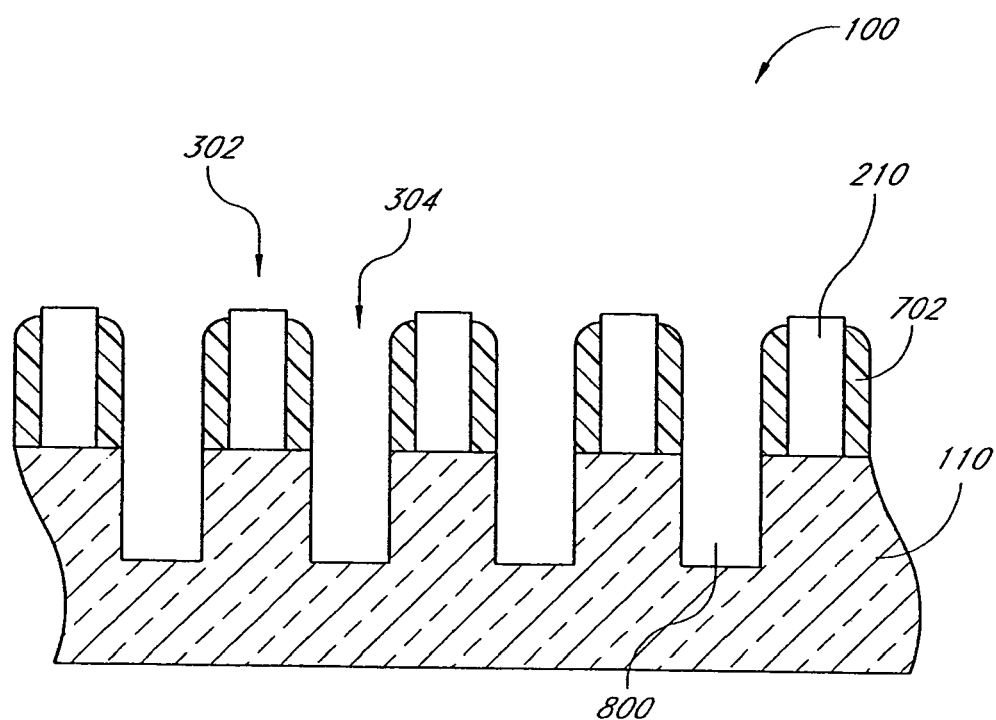
FIG. 8 illustrates a cross-sectional view taken along line A-A of an embodiment of the device of FIG. 7 after the formation of the first set of trenches.

FIG. 8 illustrates the device 100 of FIG. 7 from the same view as the first cross-section, after etching a plurality of first or "shallow" trenches 800 into the silicon substrate 110. The first trenches 800 are etched into the silicon substrate 110 at the gaps 304 using a process such as, for example, ion milling, reactive ion etching (RIE), or chemical etching. If an etching process involving a chemical etchant (including RIE) is selected, any of a variety of well-known etchants can be used, such as for example, $Cl_2$.

The first or shallow trenches 800 have a depth preferably within the range of about 2,700 Å to about 3,300 Å, and more preferably within the range of about 2,850 Å to about 3,150 Å. The first trenches 800 have a width preferably within the range of about 170 Å to about 430 Å, and more preferably within the range of about 200 Å to about 400 Å. The trenches 800 extend longitudinally in the horizontal direction of the device 100. See FIG. 3.

Figure 9:
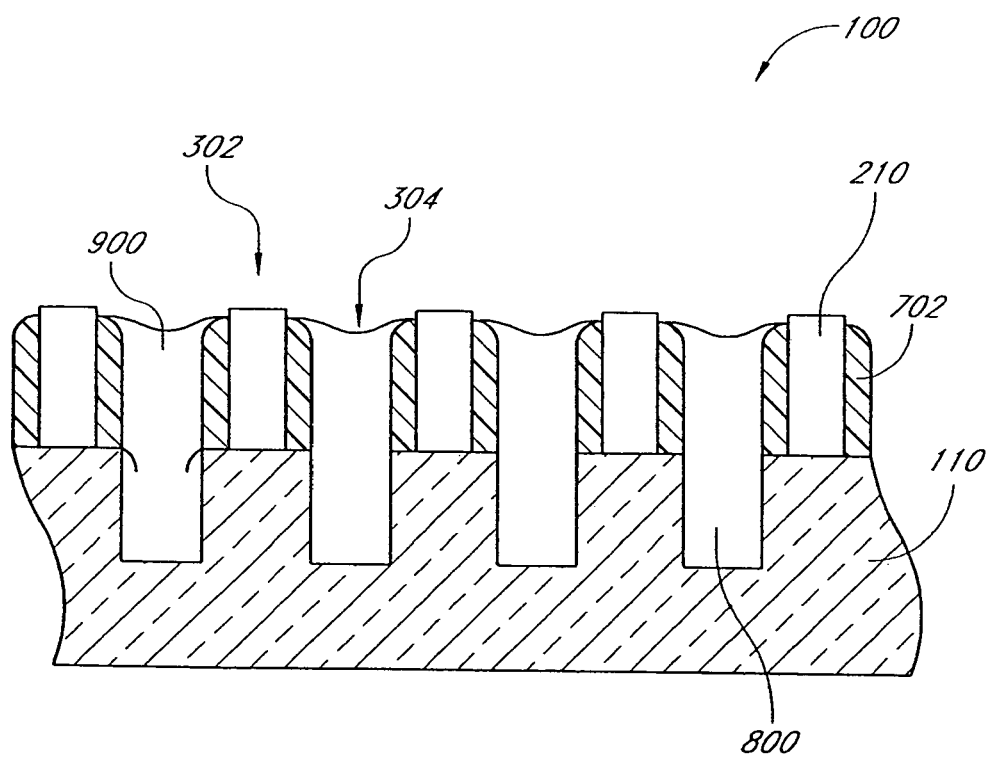
FIG. 9 illustrates a cross-sectional view taken along line A-A of an embodiment of the device of FIG. 8 after filling the first set of trenches.

FIG. 9 illustrates the device 100 of FIG. 8, from the same view as the first cross-section, after depositing a layer of material 900 to fill the first trenches 800. The material 900 can be deposited using any suitable deposition process, such as, for example, chemical vapor deposition (CVD) or physical vapor deposition (PVD). Preferably, the material 900 can be selectively etched with respect to the substrate 110 (silicon) and the nitride 702. In an embodiment, the material 900 comprises an oxide, such as, for example, silicon dioxide.

In a second embodiment, the material 900 can preferably be selectively etched with respect to the substrate 110 (silicon) and the oxide 210, and the substrate 110 (silicon) and the oxide 210 can each be selectively etched with respect to the material 900. In the second embodiment, the material 900 comprises a nitride, such as, for example, silicon nitride. See the discussion of FIGS. 32-35 for an understanding of the second embodiment.

Figure 10:
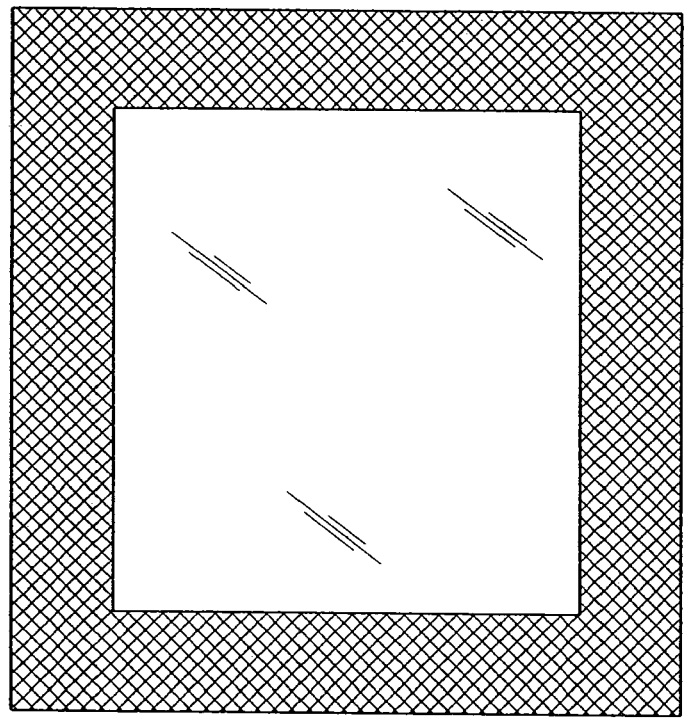
FIG. 10 illustrates a top plan view of an embodiment of a photo mask to be applied to the device illustrated in FIG. 9.

FIG. 10 illustrates a photo mask 1000 to be applied to the device 100 of FIG. 9. As described above, a typical masking process is used. In an embodiment, after depositing a layer of hard mask material to the device 100, conventional photolithography, and etching techniques are applied to etch the hard mask. The shaded portion of the photo mask 1000 represents the area in which the hard mask layer remains after applying conventional photolithography and etching techniques. The remaining hard mask layer protects the periphery of the device 100 from further processing.

The unshaded portion of the photo mask 1000 represents the area in which the conventional photolithography and etching techniques remove the hard mask layer. The removal of the hard mask layer from the surface of device 100 within the area defined by the unshaded portion of the mask 1000 permits further processing of the device 100 within the area defined by the unshaded portion of the mask 1000.

Preferably, the width of the mask 300 (FIG. 3) is narrower than the width of the opening of the mask 1000 and the length of the mask 300 (FIG. 3) is shorter than the length of the opening of the mask 1000.

Figure 11:
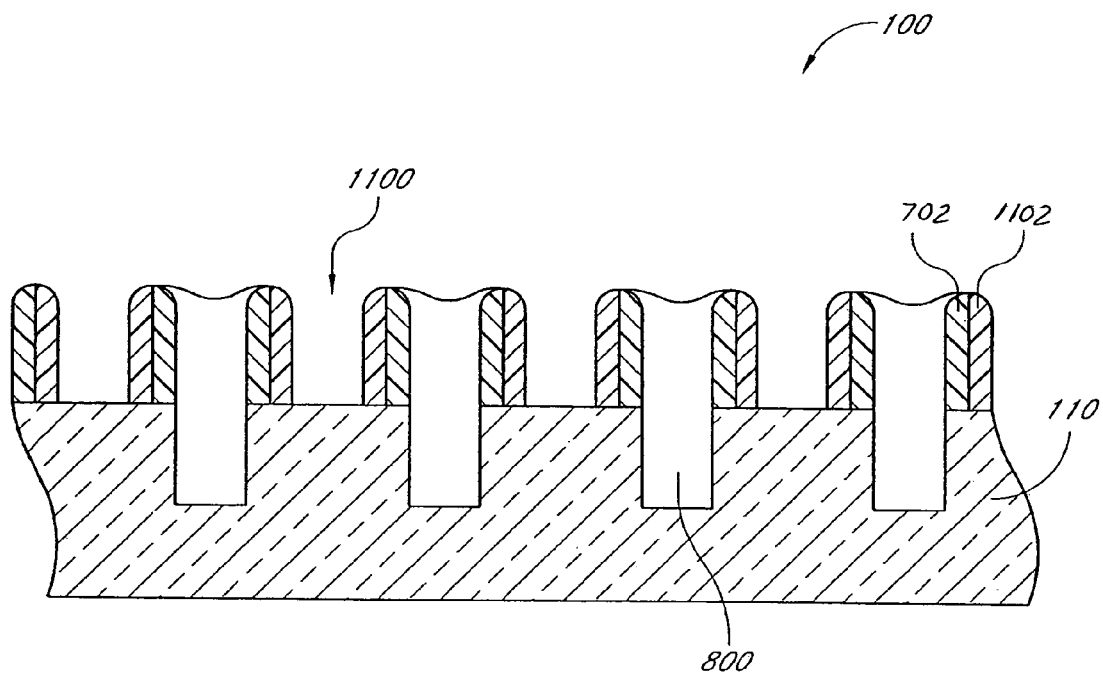
FIG. 11 illustrates a cross-sectional view taken along line A-A of an embodiment of the device of FIG. 9 after removal of the top oxide.

FIG. 11 illustrates the device 100 of FIG. 9 from the same view as the first cross-section, after removing the oxide 210. The removal of the oxide 210 creates gaps 1100 between the first trenches 800. The oxide 210 is etched down to the surface of the substrate 110 using a process such as, for example, reactive ion etching (RIE). RIE is a directional anisotropic etch having both physical and chemical components. An example of the physical etching process used in RIE is sputter etching.

As illustrated in FIG. 11, a second spacer 1102 is preferably formed beside the nitride spacer 702 in the gaps 1100 left by the oxide removal. In an embodiment, the spacer 1102 comprises a nitride-containing material, such as, for example, silicon nitride, having a thickness preferably within the range of about 360 Å to about 440 Å, and more preferably within the range of about 380 Å to about 420 Å.

In an embodiment, a process, such as an anisotropic etch, forms spacers 1102 from a layer of nitride-containing material deposited on the surface of the device 100. This process is similar to the process used to form the spacers 702, as described above. The spacer 1102 forms beside the spacer 702 and within the gap 1100 to narrow the gap 1100. The spacers 1102 preferably fill approximately ½0 to ⅔ of the gap 1100, narrowing the gap 1100 to a width preferably within the range of about 360 Å to about 440 Å, and more preferably within the range of about 380 Å to about 420 Å. The spacers 1102 extend longitudinally in the horizontal direction along lateral interior peripheries of the gaps 1100.

Figure 12:
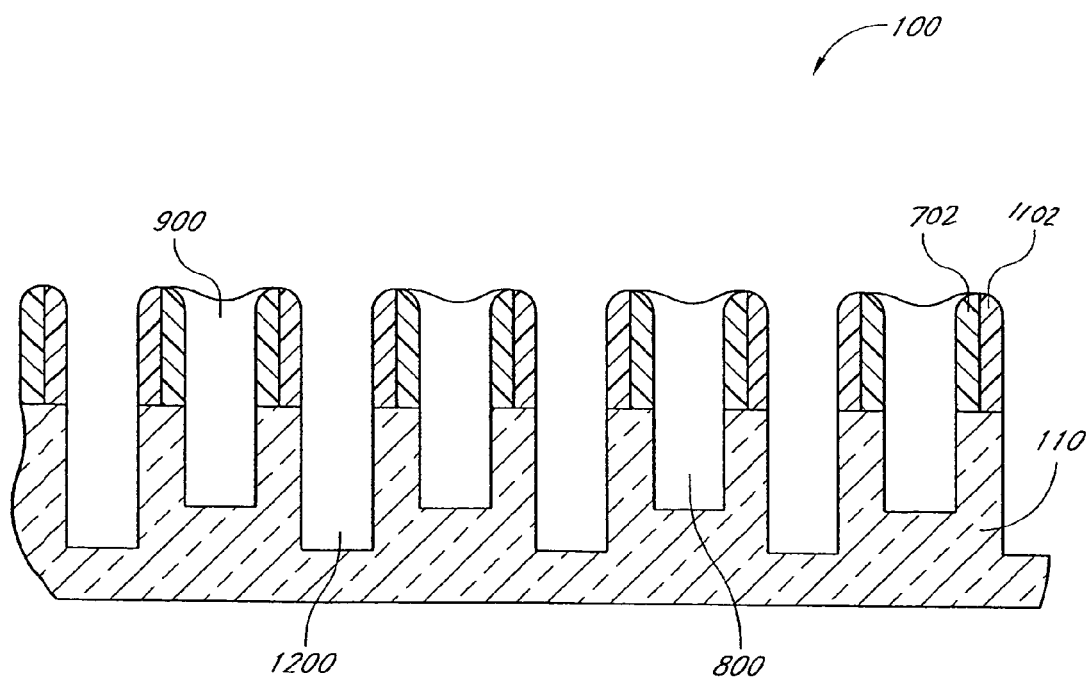
FIG. 12 illustrates a cross-sectional view taken along line A-A of an embodiment of the device of FIG. 11 after the formation of the second set of trenches.

FIG. 12 illustrates the device 100 of FIG. 11, from the same view as a first cross-section, after etching a plurality of second or "deep" trenches 1200. The second trenches 1200 are etched into the silicon substrate 110 at the gaps 1100 preferably using a directional process such as, for example, ion milling, or reactive ion etching (RIE), which selectively etches the silicon substrate 110 and does not etch the oxide and nitride materials.

The second or deep trenches 1200 have a depth preferably within the range of about 4,500 Å to about 5,500 Å, and more preferably within the range of about 4,750 Å to about 5,250 Å. The second trenches 1200 have a width preferably within the range of about 170 Å to about 430 Å, and more preferably within the range of about 200 Å to about 400 Å. The second trenches 1200 extend longitudinally in the horizontal direction of the device 100.

Preferably, as illustrated, the second trenches 1200 are deeper than the first trenches 800.

Figure 13:
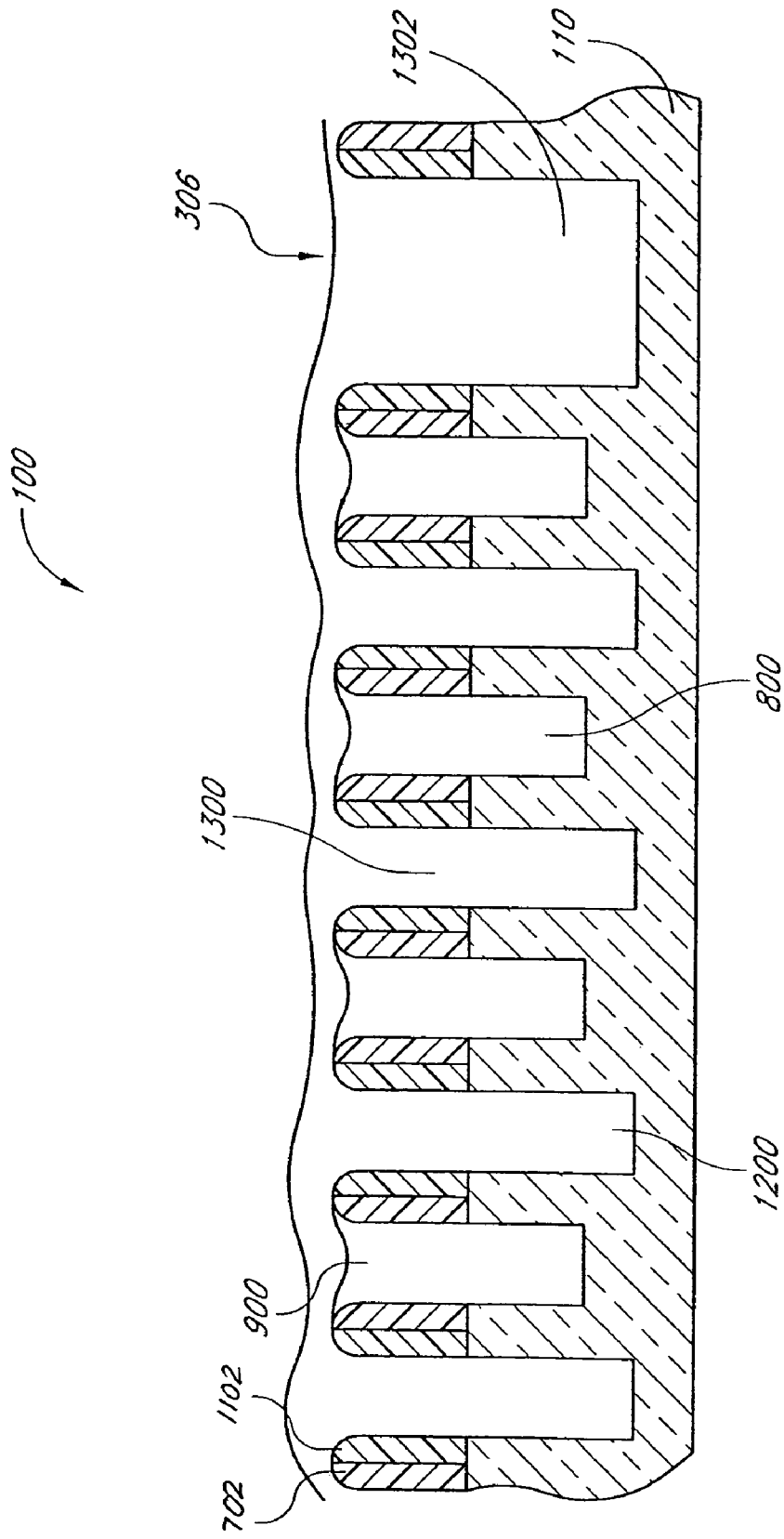
FIG. 13 illustrates a cross-sectional view taken along line A-A of an embodiment of the device of FIG. 12 and also illustrates a cross-sectional view of the contact trench after filling the second set of trenches and the contact trench.

FIG. 13 illustrates the device 100 of FIG. 12 from the same view as the first cross-section, after filling the second trenches 1200 with a material 1300. Preferably, the material 1300 can be selectively etched with respect to the substrate 110 (silicon) and silicon nitride, and the substrate 110 and the silicon nitride can each be selectively etched with respect to the material 1300. In an embodiment, the material 1300 comprises an oxide, such as, for example, silicon dioxide. The material 1300 can be deposited using any suitable deposition process, such as, for example, CVD, but is preferably by spin on glass (SOG) deposition. The material 1300 will serve as a field isolation element in the final structure as will be seen in the discussion below.

FIG. 13 also illustrates a contact trench 1302 formed by processing the contact gap 306. The contact trench 1302 is preferably simultaneously etched and filled during the process utilized to form the second trench 1200, as described above.

The contact trenches 1302 have a depth preferably within the range of about 4,500 Å to about 5,500 Å, and more preferably within the range of about 4,750 Å to about 5,250 Å. The contact trenches 1302 have a width preferably within the range of about 4 F to about 6 F, or about 2-3 lengths of the U-shaped devices. The contact trenches 1302 extend longitudinally in the horizontal direction of the device 100.

Figure 14:
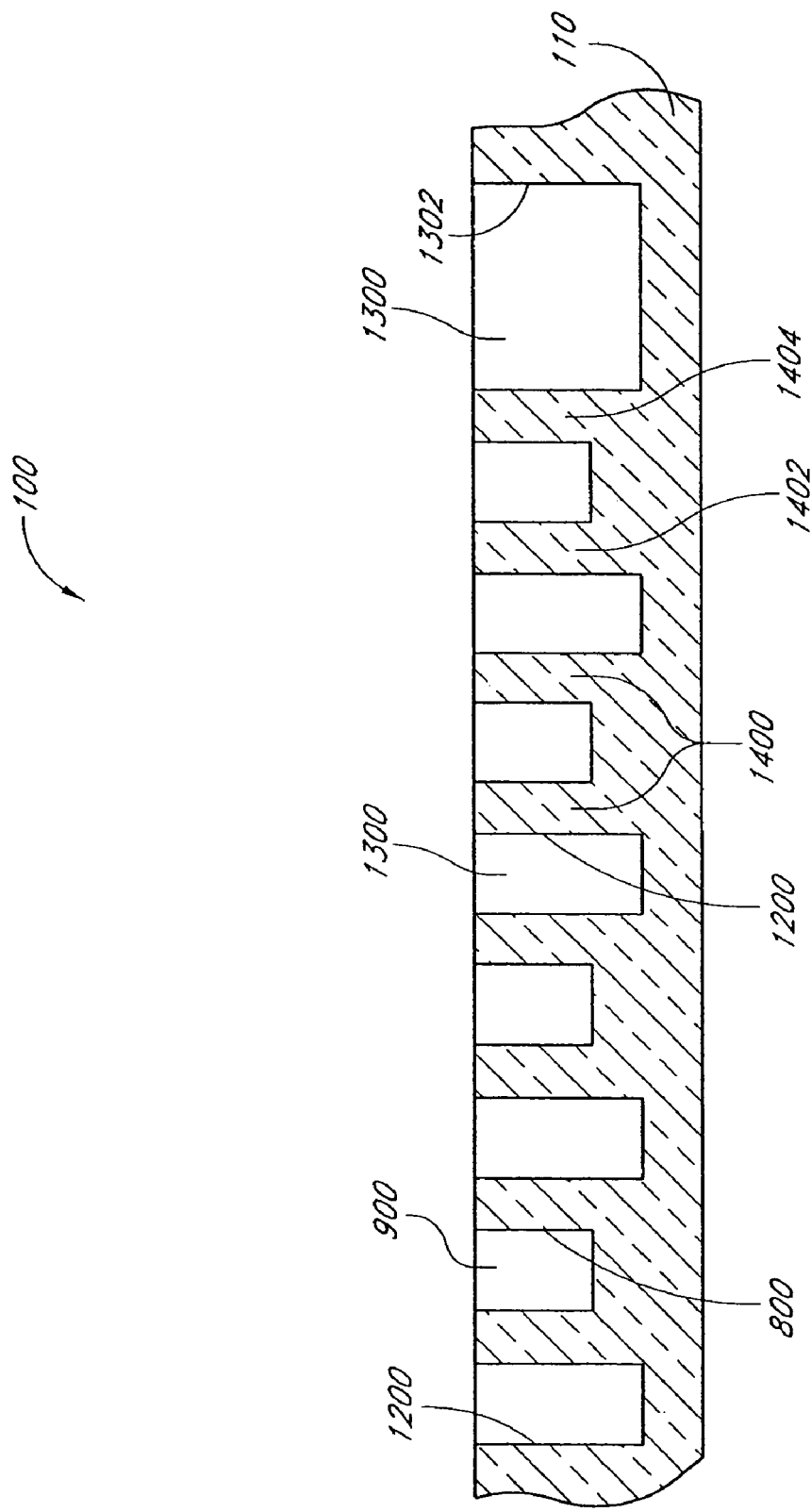
FIG. 14 illustrates a cross-sectional view taken along line A-A of an embodiment of the device of FIG. 13 after planarizing the surface.

FIG. 14 illustrates the device 100 of FIG. 13 from the same view as the first cross-section, after the planarizing the surface of the device 100. Any suitable planarization process, such as, for example, chemical mechanical planarization (CMP) may be used.

As illustrated in FIG. 14, the device 100 comprises pairs of "bulk" silicon pillars 1400. Each second or deep trench 1200, filled with oxide 1300 in the illustrated embodiment, separates one pair of "bulk" silicon pillars 1400 from the next pair of "bulk" silicon pillars 1400. The more shallow first trench 800, filled with oxide or nitride 900 in the illustrated embodiment, separates a first silicon pillar 1402 from a second silicon pillar 1404 in each pair of silicon pillars 1400.

Figure 15:
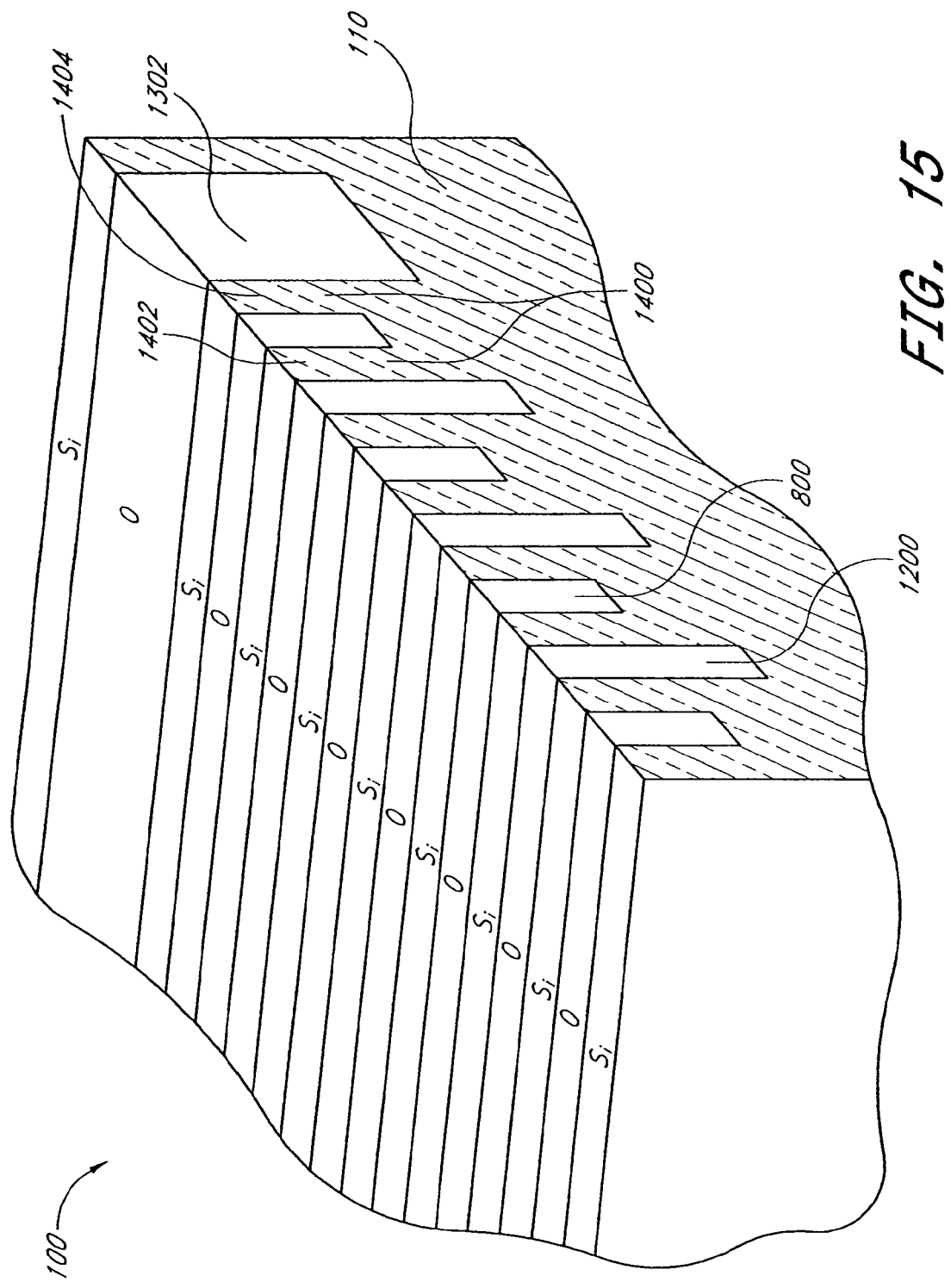
FIG. 15 illustrates a perspective view of an embodiment of the device of FIG. 14.

FIG. 15 illustrates a perspective view of the device of FIG. 14. The first or shallow trenches 800, the second or deep trenches 1200, the contact trenches 1302, and the silicon pillars 1400 extend longitudinally in the horizontal direction of the device 100.

Referring to FIG. 3, the photo mask 300 defines the lines 302 and gaps 304 etched into the device 100. By performing the processing steps as described above, the line and gap features 302, 304 of the photo mask 300 form the trenches 800, 1200 and the pillars 1402, 1404. Due to the formation of spacers protecting the silicon substrate 110 during the etching processes, the device 100 comprises approximately two pillars 1402, 1404 for every one of the line and gap photo features 302, 304 of the mask 300. The distance between identical, adjacent features of the photo mask 300 is approximately twice as big as the distance between the silicon pillars 1402, 1404, and the more densely packed pillars are said to be "double pitched" or "pitch multiplied" relative to the lithography-defined critical dimension.

Figure 16:
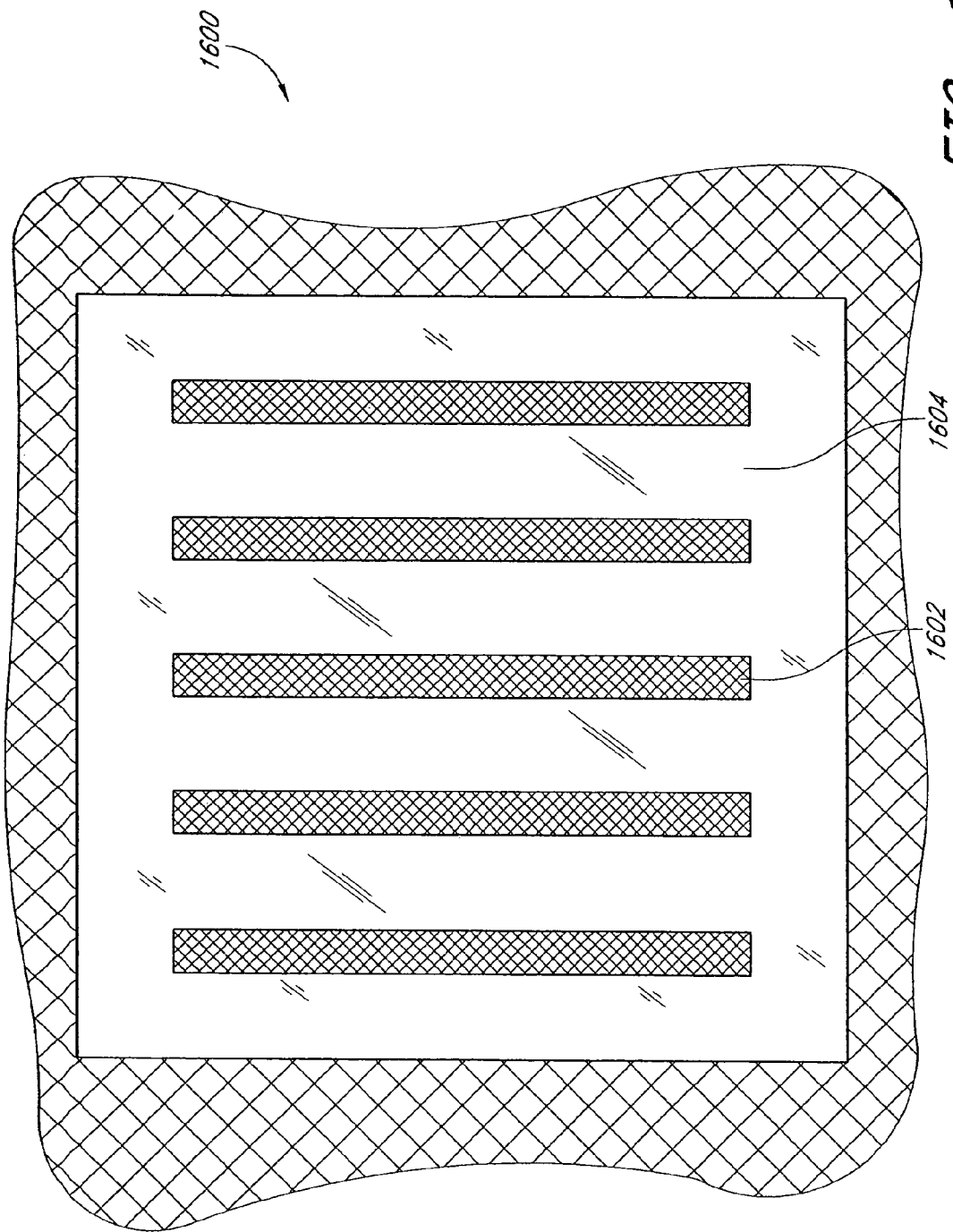
FIG. 16 illustrates a top plan view of an embodiment of a photo mask to be applied to the device illustrated in FIGS. 14 and 15.

FIG. 16 illustrates a portion of a third photo mask 1600 to be applied to the device 100 of FIG. 15. The mask 1600 forms a pattern of isolated lines 1602 within an opening. The lines 1602 are separated from one another by gaps 1604. The lines 1602 and the gaps 1604 extend along a vertical direction. The third mask 1600 also forms an area between the pattern of spaced lines 1602 and gaps 1604 and the array-bounding second mask 1000.

Referring to FIG. 7, the spacers 702 form along the lateral sides and ends of the rows of oxide 210 remaining in the lines 302, forming a loop around the end of each row of oxide 210. In addition, referring to FIG. 11, the spacers 1102 form along the lateral sides and ends of the spacers 702, forming a loop around the shallow trench 800. During an etching process described below, the area of the third mask surrounding the pattern of spaced lines 1602 and gaps 1604 causes the loop of spacers 702 and 1102 around the shallow trench 800 to be etched away. Thus, the spacers 702, 1102 extend longitudinally in the horizontal direction along lateral interior peripheries of the gaps 1100, forming lines, and not forming loops at the periphery of the device 100.

Figure 17:
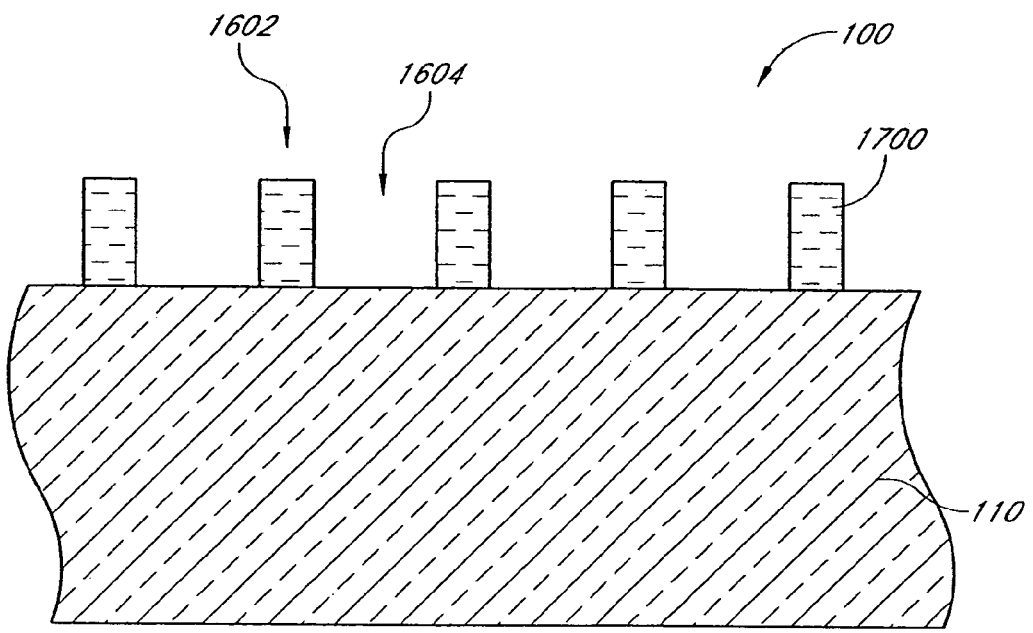
FIG. 17 illustrates a cross-sectional view taken along line B-B of an embodiment of the device of FIG. 15 after the photo mask of FIG. 16 has been applied to pattern a hard mask layer.

FIG. 17 illustrates the device of FIG. 16 after the pattern of the photo mask 1600 has been transferred to an underlying layer of hard mask material 1700. FIG. 17 illustrates the view of the device 100 into the plane formed by slicing device 100 along the line B-B, or from the view of a second cross-section, orthogonal to the first cross-section.

In an embodiment, using a carbon shrink process to further reduce the line width to less than F, where F is the minimum printable size of a feature of a photo mask, the lines 1602 are 0.5 F wide and the gaps 1604 are 1.5 F wide. The carbon shrink process does not change the pitch of the mask 1600. The shaded portions, the lines 1602, of the photo mask 1600 represent the area in which a hard mask layer remains after applying photolithography and etching techniques, and the unshaded portions, the gaps 1604 and the border 1606 (FIG. 16), represent the area in which the hard mask layer is removed.

As described above, a typical masking process is used. After depositing a layer of hard mask material 1700, the hard mask 1700 can be patterned using well-known photolithography and etching techniques. For example, in some embodiments, photoresist is deposited as a blanket layer over the device 100 and exposed to radiation through the photo mask 1600. Following this exposure, the photoresist film is developed to form a photoresist mask on the surface of the hard mask 1700, and the hard mask 1700 is etched to expose the substrate 110 in the gap regions 1604 and the border region 1606 (FIG. 16) of the device 100.

As illustrated in FIG. 17, the hard mask 1700 remains over the area of the substrate 110 where the third mask 1600 forms lines 1602. Preferably, the lines 1602 are reduced to 0.5 F wide using a carbon shrink process, (e.g., by isotropic etching), and the gaps 1604 become 1.5 F wide, where F is the minimum printable size of a feature of a photo mask.

Figure 18:
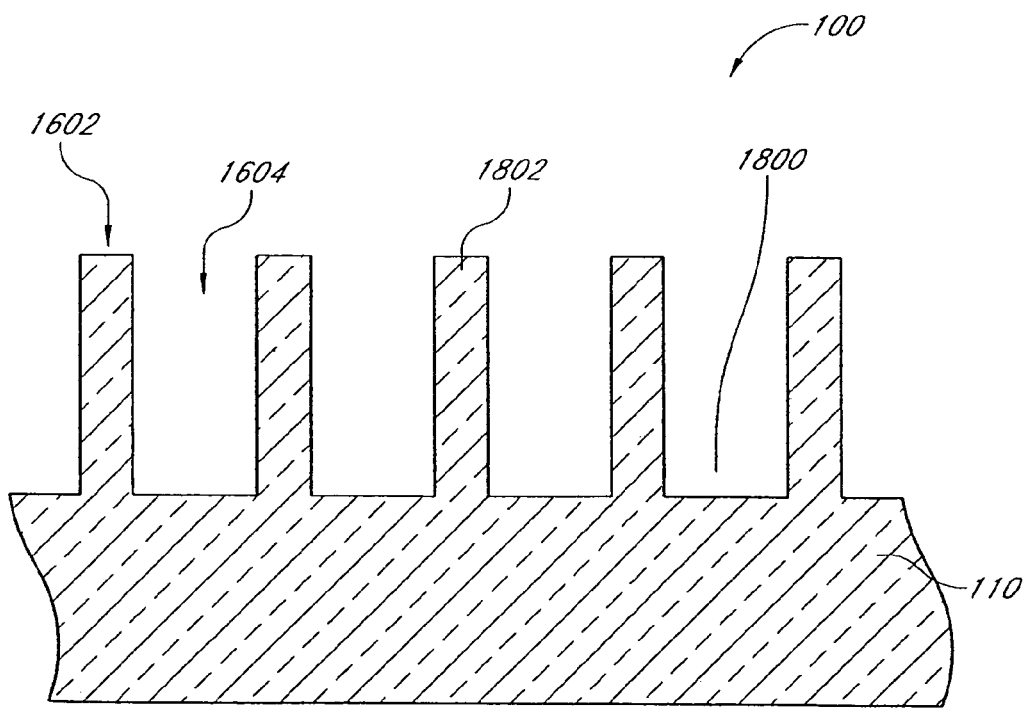
FIG. 18 illustrates a cross-sectional view taken along line B-B of an embodiment of the device of FIG. 17 after the formation of the third set of trenches orthogonal to the first and second set of trenches.

FIG. 18 illustrates the device 100 of FIG. 17 from the same view as the second cross-section, after forming a plurality of third or wordline trenches 1800 and after removing the hard mask 1700.

The third trenches 1800 are etched into the substrate 110 in the area 1604 of the device 100. The silicon substrate 110 and oxide 900, 1300 can be etched using any dry etch which etches oxide and bulk silicon at the same rate. In other embodiments, a first etch etches the silicon substrate 110 and a second etch etches the oxide 900, 1300. Alternately, the first etch etches the oxide 900, 1300 and the second etch etches the silicon substrate 110.

The third or wordline trenches 1800 have a depth preferably within the range of about 3,600 Å to about 4,400 Å, and more preferably within the range of about 3,800 Å to about 4,200 Å. The third trenches 1800 have a width of approximately 1.5 F, or preferably within the range of about 1450 Å to about 1780 Å, and more preferably within the range of about 1540 Å to about 1700 Å. The third trenches 1302 extend laterally in the horizontal plane, substantially perpendicular or orthogonal to the first trenches 800 and to the second trenches 1200, of the device 100.

Preferably, the third trenches 1800 are deeper than the first trenches 800 to allow for the formation of a transistor gate electrode along a sidewall of the third trenches 1800. Further, the third trenches 1800 are preferably not as deep as the second trenches 1200 to allow the second trenches 1200 to provide isolation between closely spaced transistors when the wordline is enabled.

The device 100 further comprises silicon pillars 1802 formed between the third trenches 1800.

Figure 19:
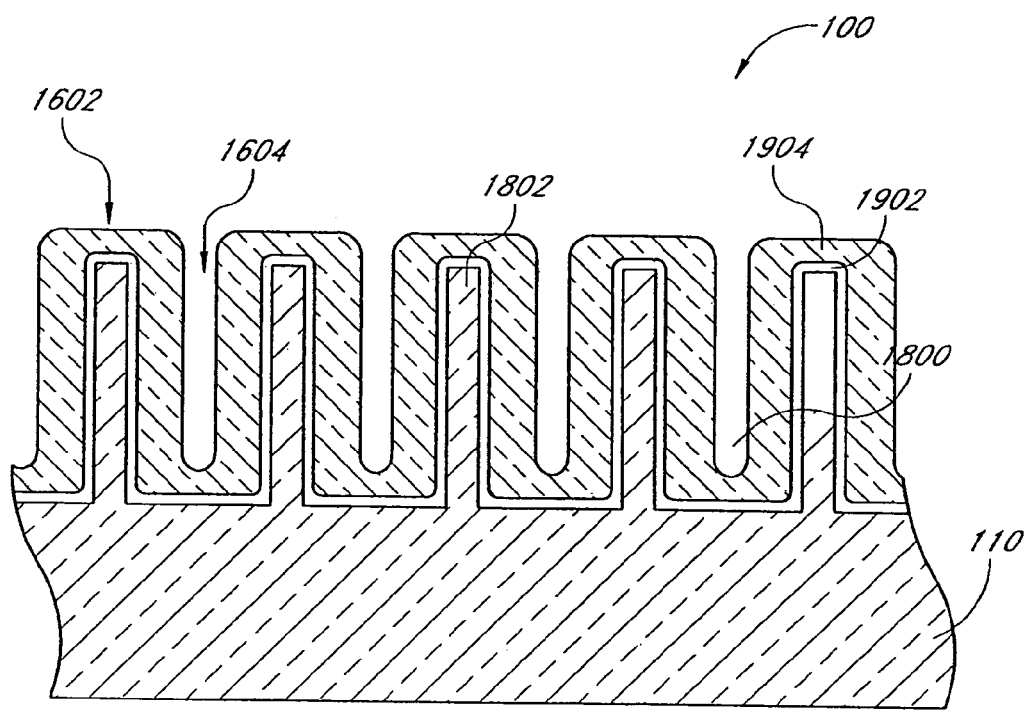
FIG. 19 illustrates a cross-sectional view taken along line B-B of an embodiment of the device of FIG. 18 after the formation of the gate dielectric and gate electrode layer.

FIG. 19 illustrates the device 100 of FIG. 18, from the same view as the second cross-section, after forming a layer of dielectric material 1902 and depositing a layer of material 1904 on the device 100. In an embodiment, the dielectric is a gate oxide comprising silicon dioxide. The dielectric 1902 has a thickness preferably within the range of about 50 Å to about 70 Å, and more preferably within the range of about 54 Å to about 66 Å. The dielectric 1902, in an embodiment, can be applied by wet or dry oxidation of the semiconductor substrate 110 followed by etching through a mask, or by dielectric deposition techniques.

In an embodiment, the material 1904 comprises a gate electrode layer, such as, for example, polysilicon, and has a thickness of approximately ½ F. Preferably, the polysilicon has a thickness of approximately 540 Å, and more preferably within the range of about 490 Å to about 510 Å. The polysilicon 1904 can be deposited using any suitable deposition process, such as, for example, chemical vapor deposition (CVD) or physical vapor deposition (PVD).

The polysilicon 1904 is also deposited in the trench formed by etching the border area 1606 (FIG. 16).

Figure 20:
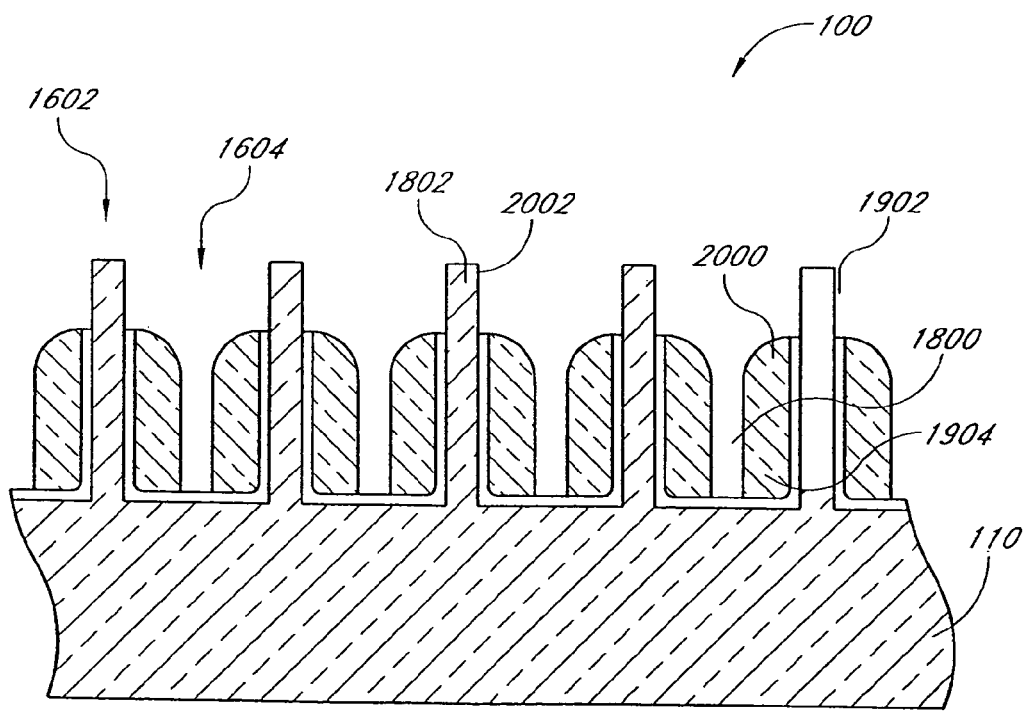
FIG. 20 illustrates a cross-sectional view taken along line B-B of an embodiment of the device of FIG. 19 after a spacer etch, and recessing the gate electrode layer and the dielectric layer.

FIG. 20 illustrates the device 100 of FIG. 19, from the same view as the second cross-section, after a spacer etch and etching and recessing the polysilicon 1904 and the dielectric 1902 to form spacers 2000. The spacer etch also separates the spacers 2000 at the bottom of the third trench 1800.

Recessing the polysilicon 1904 and the dielectric 1902 to form spacers 2000 exposes the upper side portion 2002 of the silicon pillars 1802. The recess is approximately 900 Å to approximately 1100 Å, or approximately ⅓ of the depth of the trench 1800.

Figure 21:
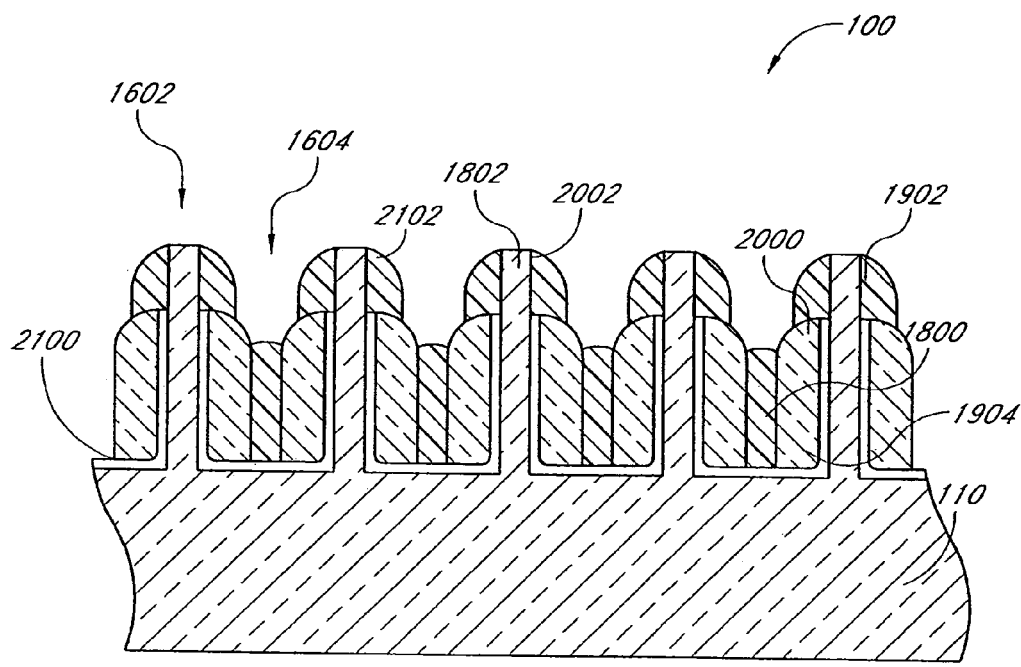
FIG. 21 illustrates a cross-sectional view taken along line B-B of an embodiment of the device of FIG. 20 after reoxidizing the device to form the bird's beaks and forming insulating spacers on top of the recessed gate electrode and gate dielectric layers.

FIG. 21 illustrates the device 100 of FIG. 20 from the same view as the second cross-section, after reoxidizing the device 100 and after forming gate isolation spacers 2102.

In some embodiments, the processing steps may cause damage to the gate oxide 1902. The reoxidization process may repair at least a portion of the damage to the gate oxide 1902 at the exposed corners: at the top of the pillars and at the bottom of the third trench 1800. The regrown gate oxide material 2100 isolates active regions of the transistors from the spacer 2000 at high field corners of the gate electrodes, and forms a characteristic bird's beak shape after completion of the reoxidization process. The spacer 2000 is the gate electrode or gate layer 2000. In an embodiment, the reoxidation is applied by wet or dry oxidation of the substrate 110, or by other common oxidation techniques. In an embodiment, the regrown gate oxide material 2100, which formed on the gate layer 1904, is etched back from the gate layer 1904.

As also illustrated in FIG. 21, the spacers 2102 are formed on the exposed upper side portion 2002 of the silicon pillars 1802. The spacers 2102 comprise a nitride-containing material, such as, for example, silicon nitride, and are formed in a process that is similar to the process used to form spacers 702, which is described above. The spacers 2102 are smaller than the spacers 2000, and reinforce shielding at high-field corners of the gate to reduce or prevent current leakage and to prevent shorting of the gate to the source/drain from a subsequent salicide process. The process that forms spacers 2102 also fills the gap between the polysilicon spacers 2000 at the bottom of the trench 1800 with the nitride-containing material.

Figure 22:
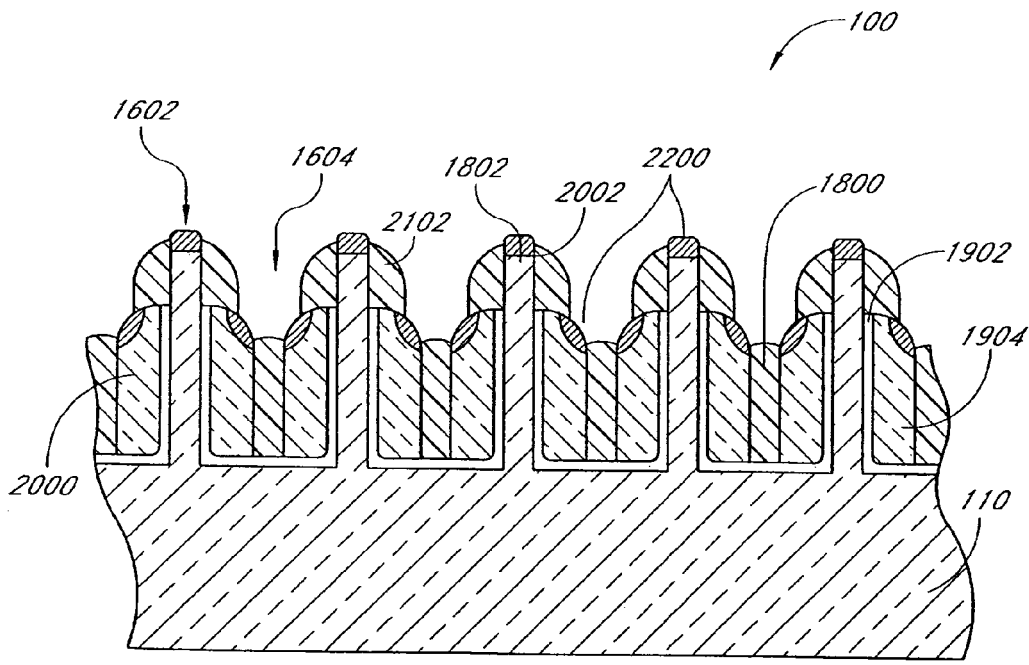
FIG. 22 illustrates a cross-sectional view taken along line B-B of an embodiment of the device of FIG. 21 after depositing a metal layer and performing a self-aligned silicidation process.

FIG. 22 illustrates the device 100 of FIG. 21, from the same view as the second cross-section, after forming a conductive layer 2200.

In an embodiment, the polysilicon spacers 2000 are salicided (self-aligned silicidation) to form a layer of conductive material 2200. A metal layer is blanket deposited and an anneal step causes silicidation where ever the metal contacts silicon, such as on the top of the pillars and on the exposed surface of the polysilicon spacers 2000. In an embodiment, the silicide material 2200 comprises a silicon and a metal, such as, for example, tungsten, titanium, ruthenium, tantalum, cobalt, and nickel, and is between approximately 100 Å and 300 Å thick, and more preferably between approximately 190 Å and 210 Å thick. A selective metal etch removes excess metal and metal that does not contact silicon.

The metal silicide forms a self-aligned strapping layer 2200 to increase lateral conductivity along the wordline. The metal silicide also forms on the tops of the pillars 1802 to provide source and drain contacts, as will be better understood from the discussion of FIG. 29 below. An optional physical etch ensures the separation of the spacers 2000 at the bottom of the trench 1800.

Those of ordinary skill in the art will recognize that the conductive layer 2200 may also be made of other metals, such as, for example, gold, copper aluminum, and the like, and need not react with the silicon. Mixtures of metals are also suitable for forming the conductive layer 2200. If the metal strapping layer 2200 is not formed by a salicide process, then the preferred process is selective deposition on silicon. Other methods of depositing the conductive layer 2200 include, but are not limited to, rapid thermal chemical vapor deposition (RTCVD), low pressure chemical vapor deposition (LPCVD), and physical vapor deposition (PVD).

Figure 23:
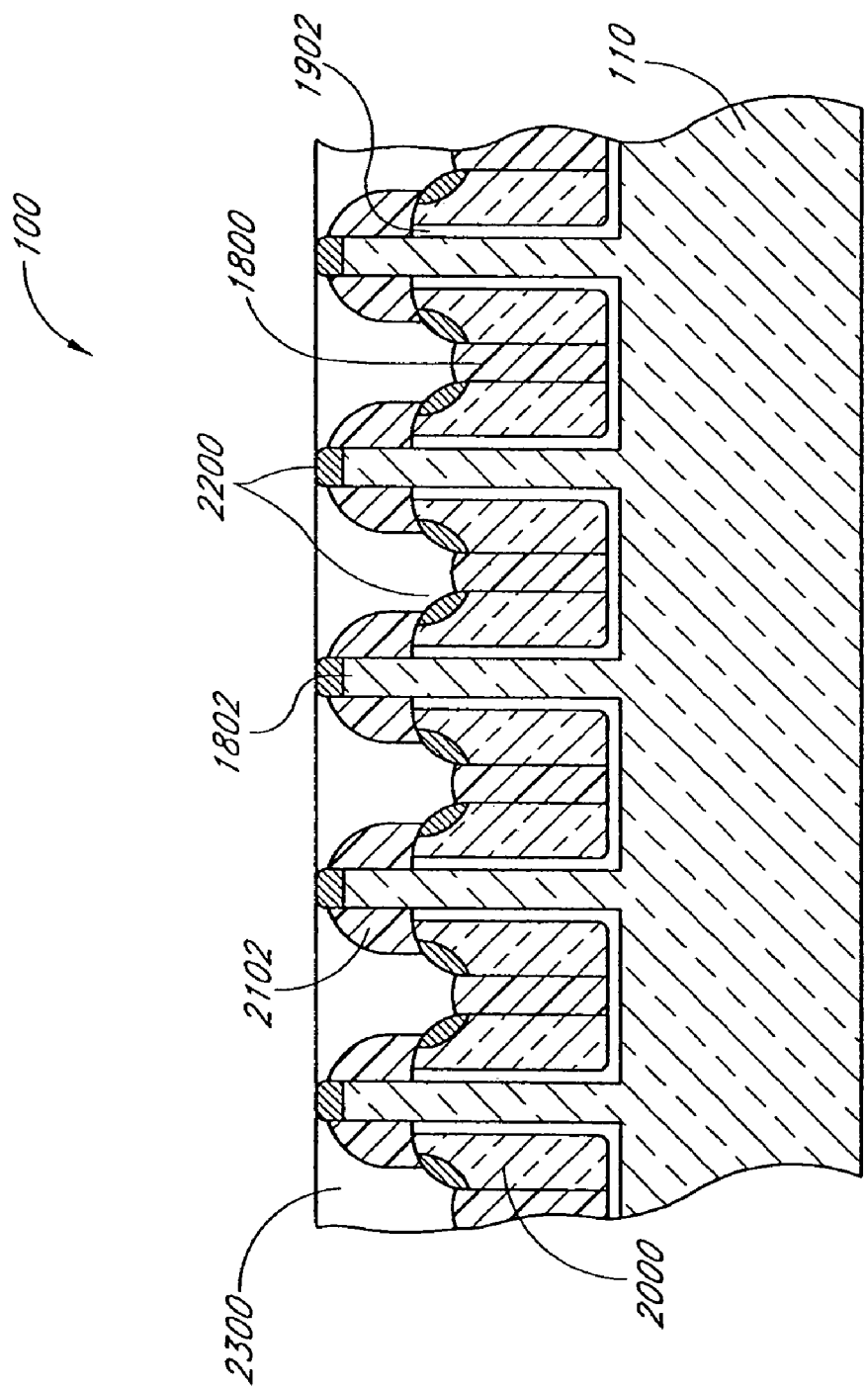
FIG. 23 illustrates a cross-sectional view taken along line B-B of an embodiment of the device of FIG. 22 after filling the third set of trenches and planarizing the surface.

FIG. 23 illustrates the device 100 of FIG. 22 from the same view as the second cross-section, after filling the remainder of the third trenches 1800 with an insulating material 2300. In an embodiment, the insulating material 2300 comprises an oxide such as, for example, silicon dioxide. The insulating material 2300 can be deposited using any suitable deposition process, such as, for example, SOD, CVD, or PVD.

FIG. 23 also illustrates the device 100 after planarization. Any suitable planarization process, such as, for example, chemical mechanical polishing (CMP) may be used. The CMP slurry is preferably selective versus the silicide to protect the contacts on the pillar tops.

From the view of the second cross-section, the device 100 comprises a row of silicon pillars 1802 separated from one another by the plurality of oxide filled third trenches 1800. The silicon pillars 1802 are preferably approximately 410 Å to 510 Å wide, and more preferably 440 Å to 480 Å wide. The third trenches 1800 further comprise the gate dielectric 1902, the gate layer 2000, and the conductive strapping layer 2200.

Figure 24:
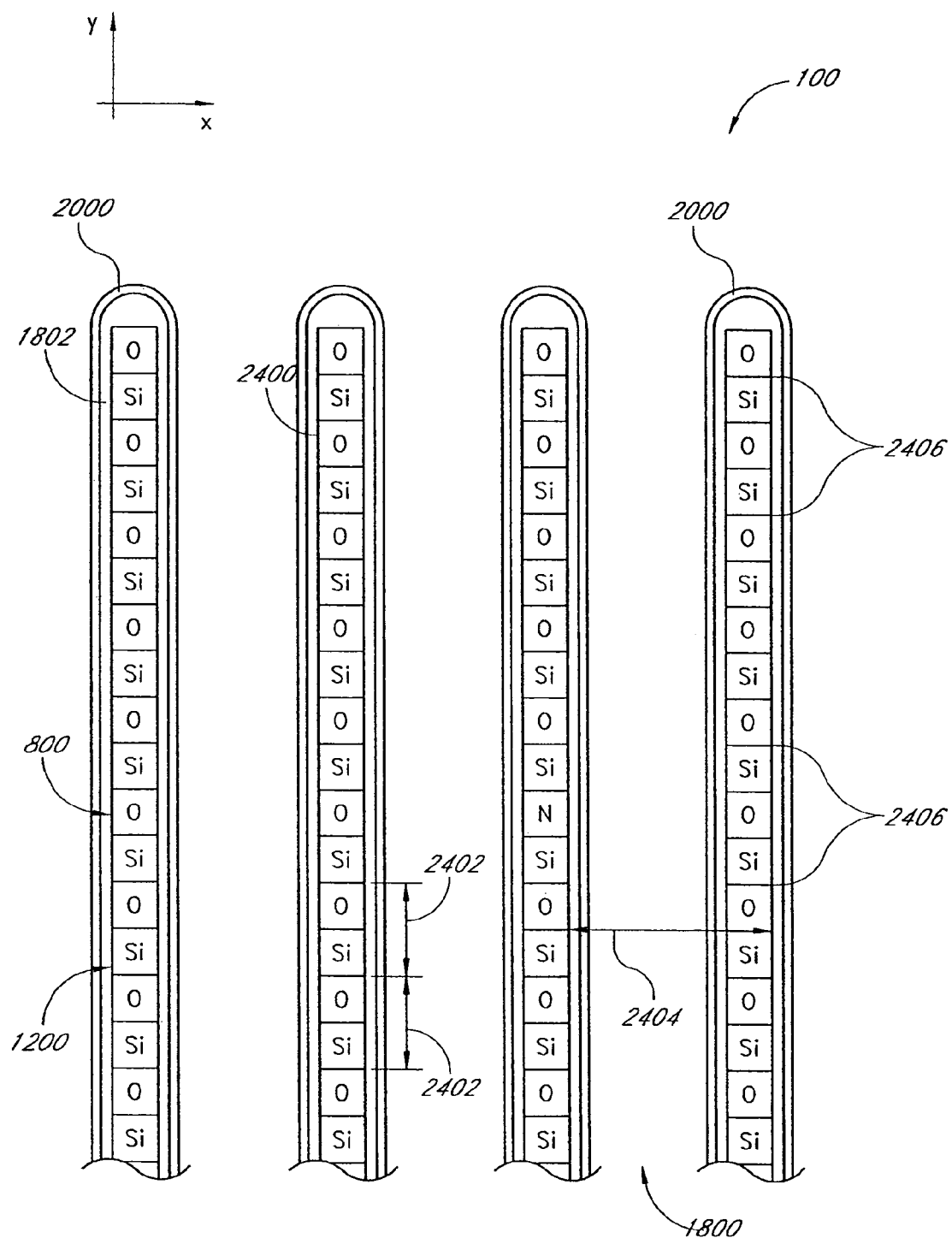
FIG. 24 illustrates a schematic top plan view of an embodiment of the device of FIG. 23.

FIG. 24 illustrates a top view of the device 100. The device 100 comprises an array of silicon pillars 1802, the first or shallow trenches 800, the oxide-filled second or deep trenches 1200, and the oxide-filled third or wordline trenches 1800. The first or shallow trenches are filled with oxide in the illustrated embodiment, and filled with nitride in another embodiment (see FIGS. 32-34 and related text). The device 100 further comprises the dielectric layer 1902 (not shown), the wordline spacer 2000, and the metal strapping layer 2200. The dielectric layer 1902, which forms only on the sides of the silicon pillars 1802, and is a thin layer separating the wordline spacer 2000 from the silicon pillars 1802, is not shown for clarity. The metal strapping layer 2200 is not shown for clarity.

The array of silicon pillars 1802 has a first pitch 2402 and a second pitch 2404. The pitch is the distance between repeating elements in the array. The first pitch 2402 is the width of the silicon pillar 1802 as measured in the y-direction plus the distance between silicon pillars 1802 as measured in the y-direction. The second pitch 2404 is the length of the silicon pillar 1802 as measured in the x-direction plus the distance between silicon pillars 1802 as measured in the x-direction. In an embodiment, the second pitch 2404 is approximately twice as big as the first pitch 2402.

Pairs of pillars 1802 further form protrusions 2406 of vertical transistors. Each vertical transistor protrusion 2406 comprises two pillars 1802, which are separated by the oxide or nitride-filled first or shallow trench 800 and connected by a channel base segment 2407 that extends beneath the shallow trench 800. The vertical transistors 2406 are separated from one another in the y-direction by the oxide-filled second or deep trenches 1200.

The wordline spacers or wordlines 2000 are separated from one another by the oxide-filled third or wordline trenches 1800.

Figure 25:
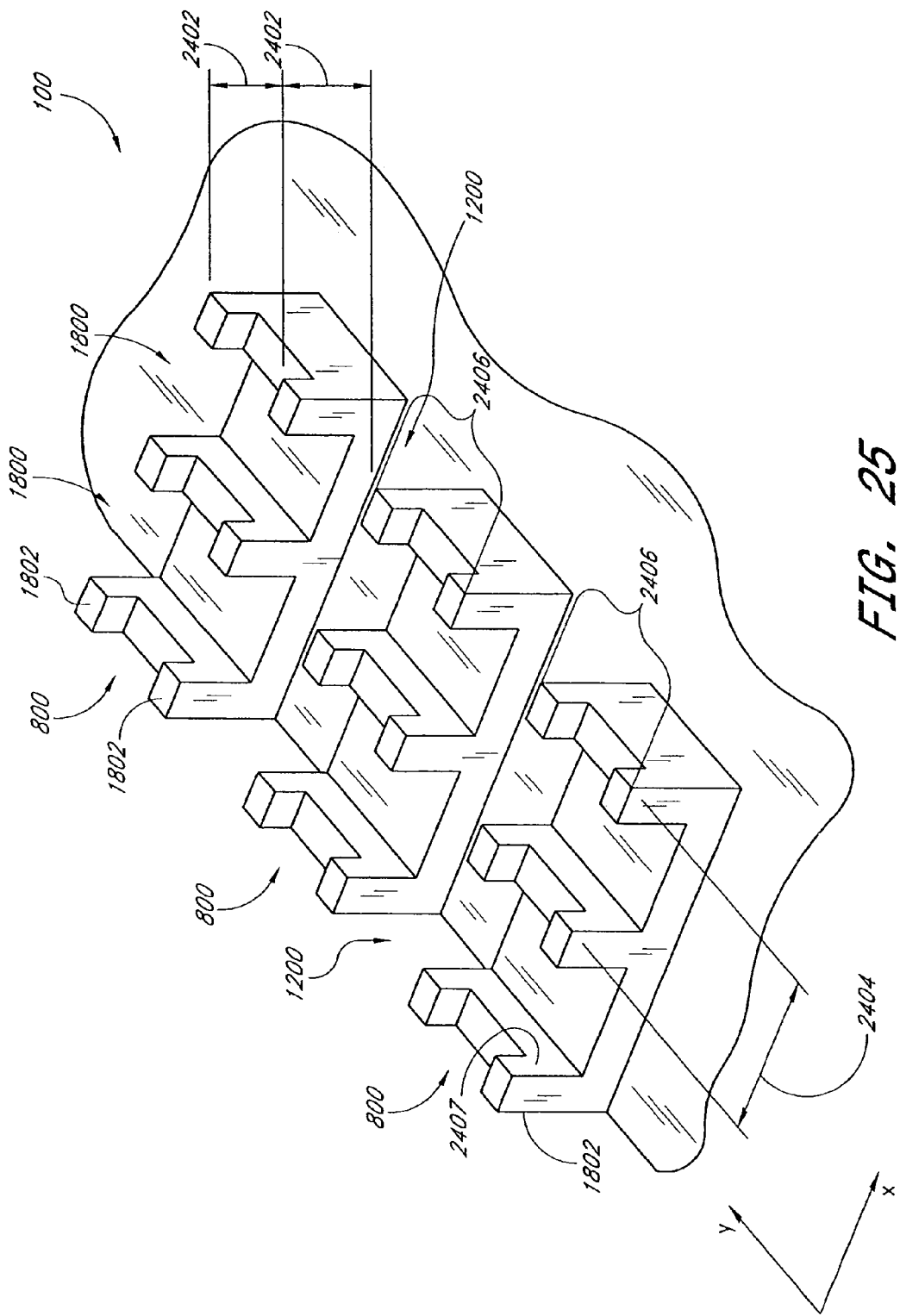
FIG. 25 illustrates a perspective view of U-shaped protrusions of the transistors and trenches of FIGS. 23 and 24, shown without filler material for purposes of illustration.

FIG. 25 illustrates a perspective view of the silicon pillars 1802 of the device 100. The dielectric layer 1902, the wordline 2000, and the metal strapping layer 2200, which are formed in the wordline trench 1800, have been left off for clarity. Also, the trenches 800, 1200, 1800 are shown unfilled for clarity.

FIG. 25 illustrates a plurality of U-shaped protrusions 2406 formed by the crossing trenches described above. Each U-shaped protrusion includes a pair of pillars 1802 connected by a channel base segment 2407. Each U-shaped protrusion 2406 includes the source, drain and channel regions of the vertical transistor. In particular, each pillar 1802 of the pair of pillars 1802 forms a source or a drain region of the transistor. The first trench 800 separates one pillar 1802 of the protrusion 2406 from the other pillar 1802 of the protrusion 2406. The second trench 1200 separates one transistor protrusion 2406 from another transistor protrusion 2406 in the y-direction.

Each U-shaped pillar construction has two U-shaped side surfaces facing a wordline trench 1800, forming a two-sided surround gate transistor. Each U-shaped pillar pair comprises two back-to-back U-shaped transistor flow paths having a common source, drain, and gate. Because the back-to-back transistor flow paths in each U-shaped pillar pair share the source, drain, and gate, the back-to-back transistor flow paths in each U-shaped pillar pair do not operate independently of each other. The back-to-back transistor flow paths in each U-shaped pillar pair form redundant flow paths of one transistor protrusion 2406.

When the transistors are active, the current i stays in left side and right side surfaces of the U-shaped transistor protrusion 2406. The left side and right side surfaces of the U-shaped transistor protrusion 2406 are defined by the third or wordline trenches 1800. The current for each path stays in one plane. The current does not turn the corners of the U-shaped transistor protrusion 2406. The transistors, in an embodiment, can become fully depleted.

The wordlines 2000 surround a column of U-shaped transistors. The third or wordline trench 1800 separates one wordline 2000 from another wordline 2000 in the x-direction.

In an embodiment, the second trench 1200 is deeper than the third trench 1800, and the third trench 1800 is deeper than the first trench 800.

In an embodiment, the first trench 800 is filled with the oxide-containing material 900, the second trench 1200 is filled with the oxide-containing material 1300, and the third trench 1800 is filled with the oxide-containing material 2300. Optionally, in another embodiment, the first trench 800 is filled with nitride-containing material, the second trench 1200 is filled with oxide-containing material, and the third trench 1800 is filled with oxide-containing material. Additional processing steps could remove the nitride containing material from the first trench 800 and fill the first trench 800 with a conductive material, as will be further discussed with respect to the embodiment of FIGS. 32-35 below.

Figure 26:
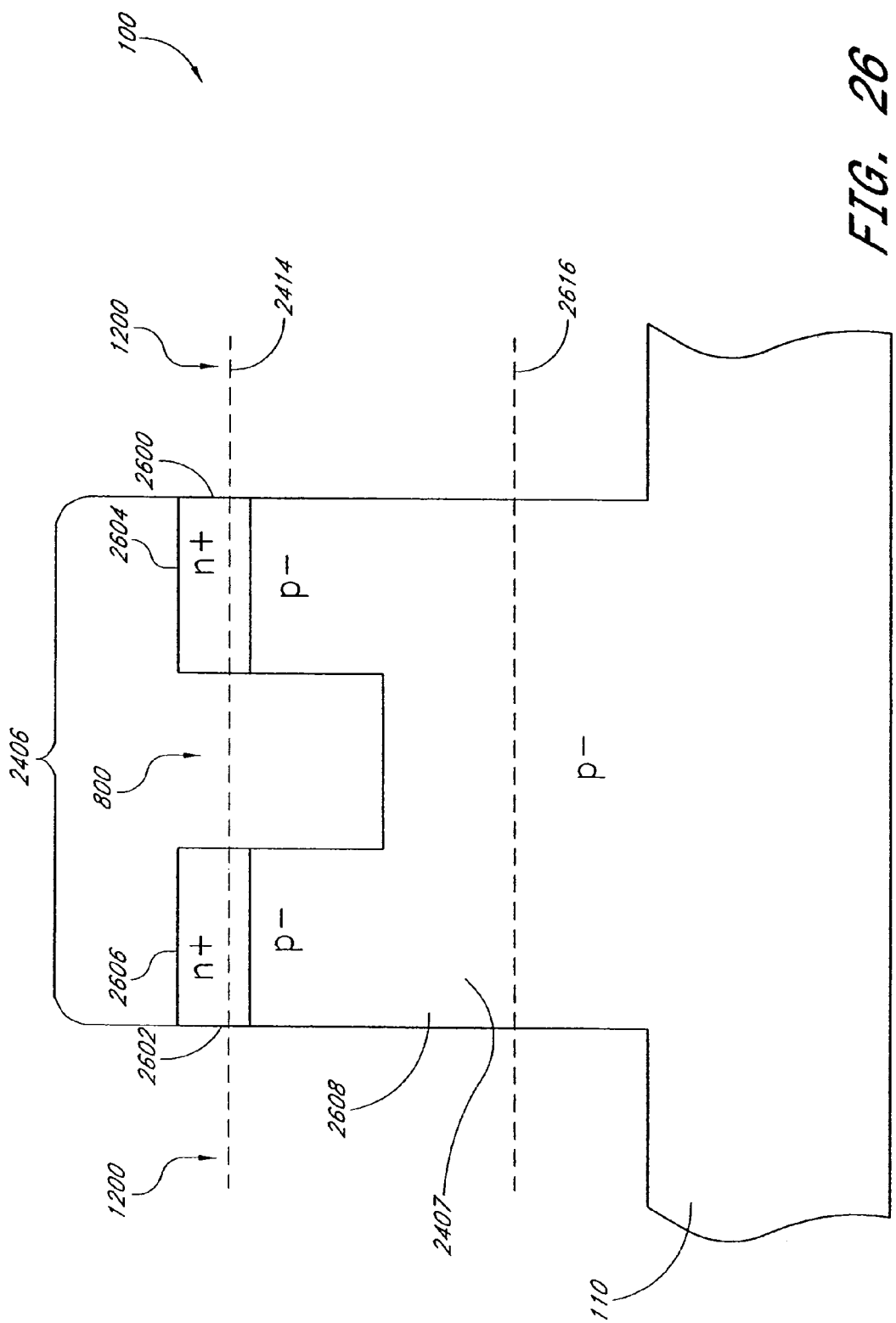
FIG. 26 illustrates a cross-sectional view of an embodiment of a U-shaped transistor, showing n+ source and drain regions, a p– channel, and the relative location of the gate electrode.

FIG. 26 illustrates one embodiment of the transistor from the same view as the first cross-section, in which the gate line spacer 2000 (not shown) gatedly connects the source/drain regions of the transistor protrusion 2406 to each other. While the gate line spacer 2000 is not shown in FIG. 26 because it is parallel to the plane of view, the height of the gate line spacer 2000 is indicated by dashed lines 2414, 2416. Dashed line 2416 also indicates the bottom of the third or wordline trench 1800.

The transistor protrusion 2406 comprises a first silicon pillar 2600 and a second silicon pillar 2602 connected by the channel base segment 2407. Each of pillars 2600, 2602 has an n+ doped source/drain region in an uppermost portion of the pillar, with the heavily-doped region of pillar 2600 being labeled 2604 and the heavily-doped region of pillar 2602 being labeled 2606.

The transistor protrusion 2406 further comprises a doped region 2608 that extends from the n+ doped region 2606, through the channel base segment 2407, to the doped region 2604, with such doped region 2608 indicated to be p−. The doped region 2608 forms a U-shaped channel of the transistor.

The n+ doped source/drain region 2604 of the first pillar 2600 connects with the n+ doped source/drain region 2606 of the second pillar 2602 through the U-shaped channel 2608. The channel length of the transistor is the length extending from source/drain region 2604 to source/drain region 2606 through the U-shaped channel 2608.

The channel characteristics of the device can be influenced by tailoring the dopant concentrations and types along the channel length. Additionally, characteristics of the device can be influenced by the type of materials utilized for pillars 2600 and 2602. Further, the device characteristics are influenced by the type of material utilized for the gate line spacer 2000 and the thickness of the gate line spacer 2000.

Preferably, the semiconductor substrate 110 is doped to create channel and source/drain regions prior to the etch steps described above. In an embodiment, the epitaxial layer 104 is doped to create source/drain regions prior to processing the semiconductor device 100. In another embodiment, the semiconductor substrate 110 is doped to create source/drain regions in additional processing steps during the etch steps described above. In a further embodiment, the semiconductor substrate 110 is doped to create source/drain regions in additional processing steps after the etch steps described above. The semiconductor device 100 can be doped using any suitable doping process, such as, for example, ion implantation or diffusion.

FIG. 26 illustrates an exemplary embodiment of the invention, and it is to be understood that the invention also encompasses various modifications. For instance, the dopant types shown in FIG. 26 can be reversed relative to the shown embodiment. Thus, all of the n-type regions can be converted to opposite conductivity (i.e. p-type) regions, and likewise the p-type regions can be converted to opposite-conductivity (i.e. n-type) regions.

Figure 27:
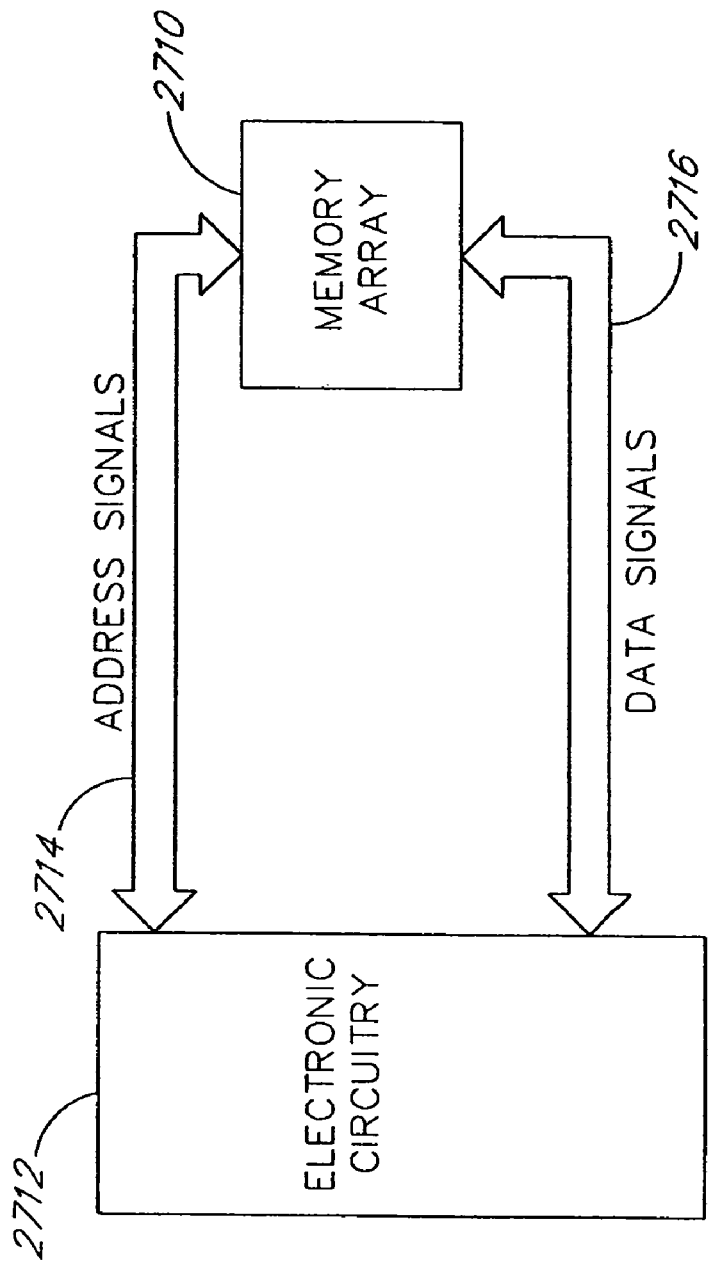
FIG. 27 is a schematic diagram depicting communication between a microprocessor and a memory device.

FIG. 27 illustrates a memory array 2710 that interfaces with other electronic circuitry 2712 via conventional address signals 2714 and data signals 2716. The address signals 2714 select one or more memory cells in the memory array 2710. The data signals 2716, on the other hand, carry data that is stored in or retrieved from the memory array 2710.

In one embodiment, the memory array 2710 is a dynamic random access memory (DRAM). In other embodiments the memory array 2710 may comprise a wide variety of memory devices such as static memory, dynamic memory, extended data out memory, extended data out dynamic random access memory (EDO DRAM), synchronous dynamic random access memory (SDRAM), double data rate synchronous dynamic random access memory (DDR SDRAM), synchronous link dynamic random access memory (SLDRAM), video random access memory (VRAM), rambus dynamic random access memory (RDRAM), static random access memory (SRAM), flash memories, or any other memory type known in the art.

The memory array 2710 interfaces with different types of electronic circuitry 2712. By way of example, the electronic circuitry 2712 can include any device, which accesses or relies on memory including, but not limited to, computers, and the like.

The computers comprise, by way of example, processors, program logic, or other substrate configurations representing data and instructions, which operate as described herein. In other embodiments, the processors can comprise controller circuitry, processor circuitry, processors, general purpose single-chip or multi-chip microprocessors, digital signal processors, embedded microprocessors, microcontrollers and the like.

In some embodiments, the memory array 2710 and the electronic circuitry 2712 are implemented separately. In other embodiments, the memory array 2710 and the electronic circuitry 2712 are integrated together. Furthermore, one of ordinary skill in the art will recognize that the memory array 2710 can be implemented in a wide variety of devices, products, and systems.

Figure 28:
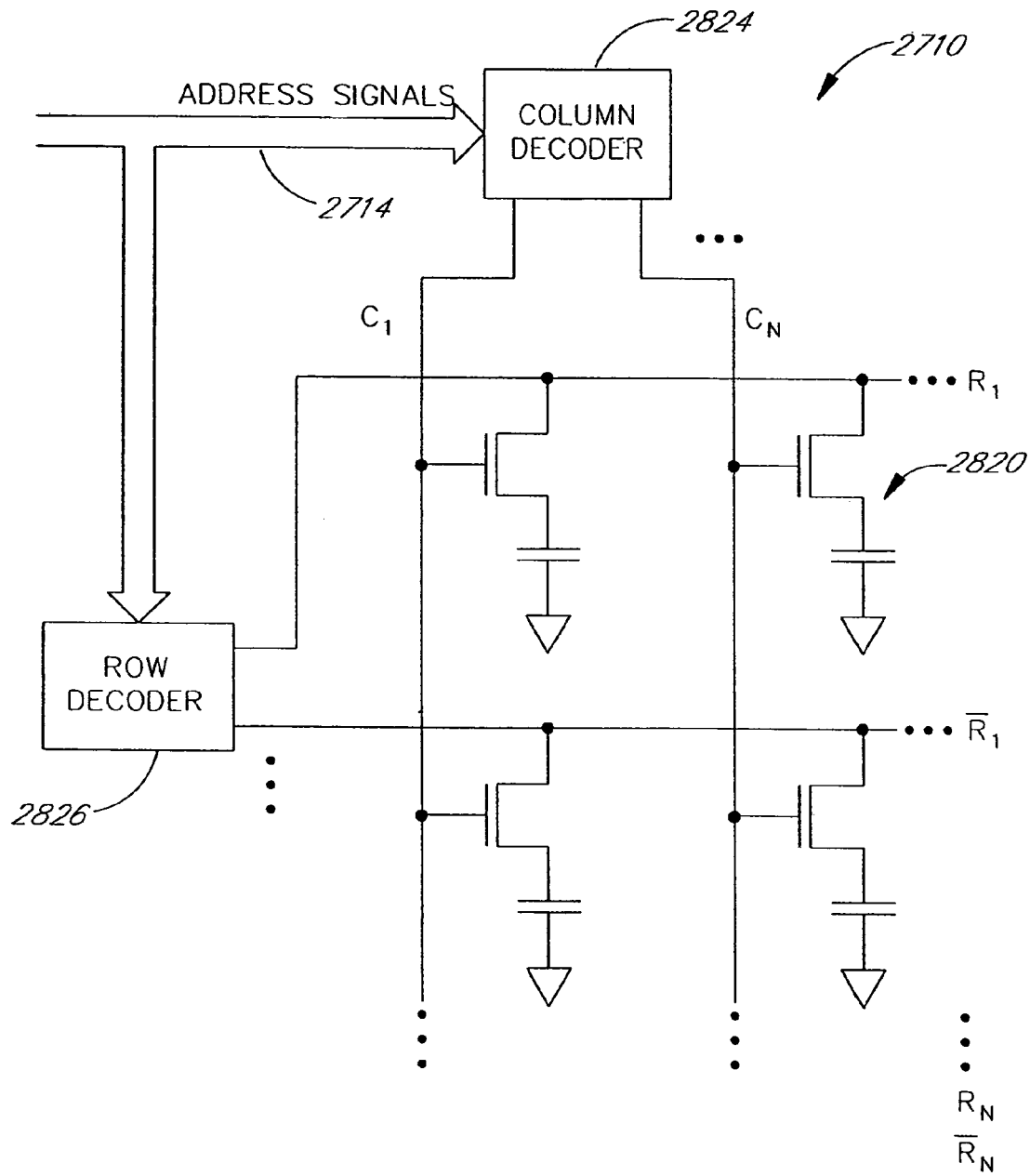
FIG. 28 is a circuit diagram of a memory array containing multiple wordlines and digit lines.

FIG. 28 illustrates the memory array 2710 that comprises a plurality of memory cells 2820. These memory cells 2820 are organized into columns $C_1$-$C_N$ and rows $R_1$-$R_N$. A column decoder 2824 and a row decoder 2826 process the address signals 2714 to identify the column $C_N$ and row $R_N$ of the targeted memory cell 2820. The columns (in the illustrated configuration) are commonly known as wordlines and the rows are typically known as digit lines.

Figure 29:
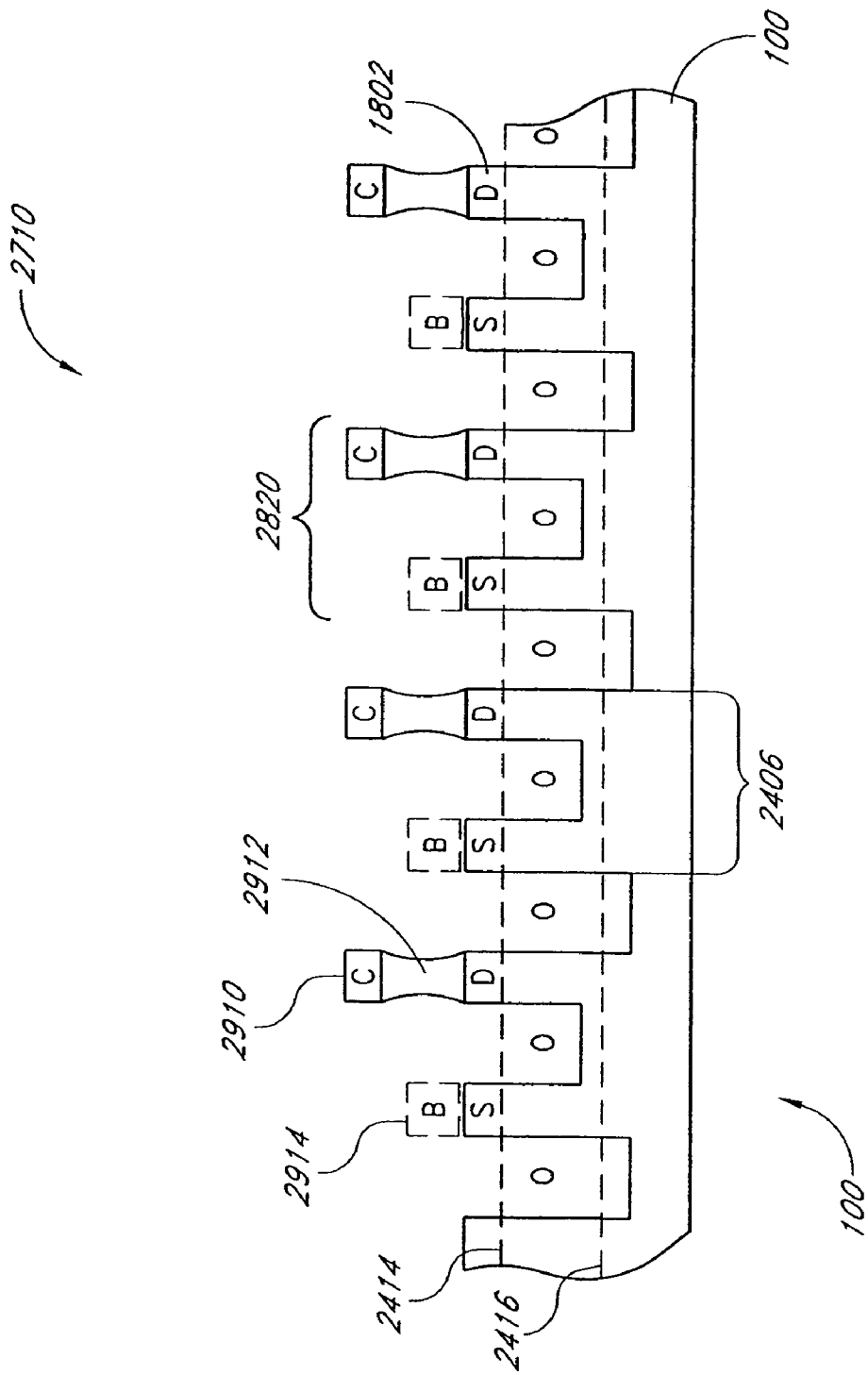
FIG. 29 illustrates a schematic cross-section of a portion of a memory array.

FIG. 29 illustrates a portion of the memory array 2710 formed by the device 100. In an embodiment, one of the pillars 1802 of each vertical transistor connects to a digit line or bitline 2914 (B) and the other pillar 1802 of the transistor connects to a memory storage device 2910 (C), such as, for example, a capacitor, to form a portion of a memory device, such as, for example, a DRAM. In an embodiment, the memory storage device 2910 electrically connects to one of the pillars 1802 of the transistor through a plug or contact 2912. The wordline 2000 is indicated by the dashed lines 2414, 2416.

In a typical embodiment, the memory cell 2820, comprising the U-shaped transistor protrusion 2406, the contact 2912, and the memory storage device 2910, and the bitline 2914, occupy a 4 $F^2$ space in the memory array 2710, where F is the minimum printable feature defined by the photoresist masks 300, 1600. In the embodiment illustrated by FIGS. 1-29, the spacers 702, 1102, reduce the F sized features of the photoresist mask.

Figure 30:
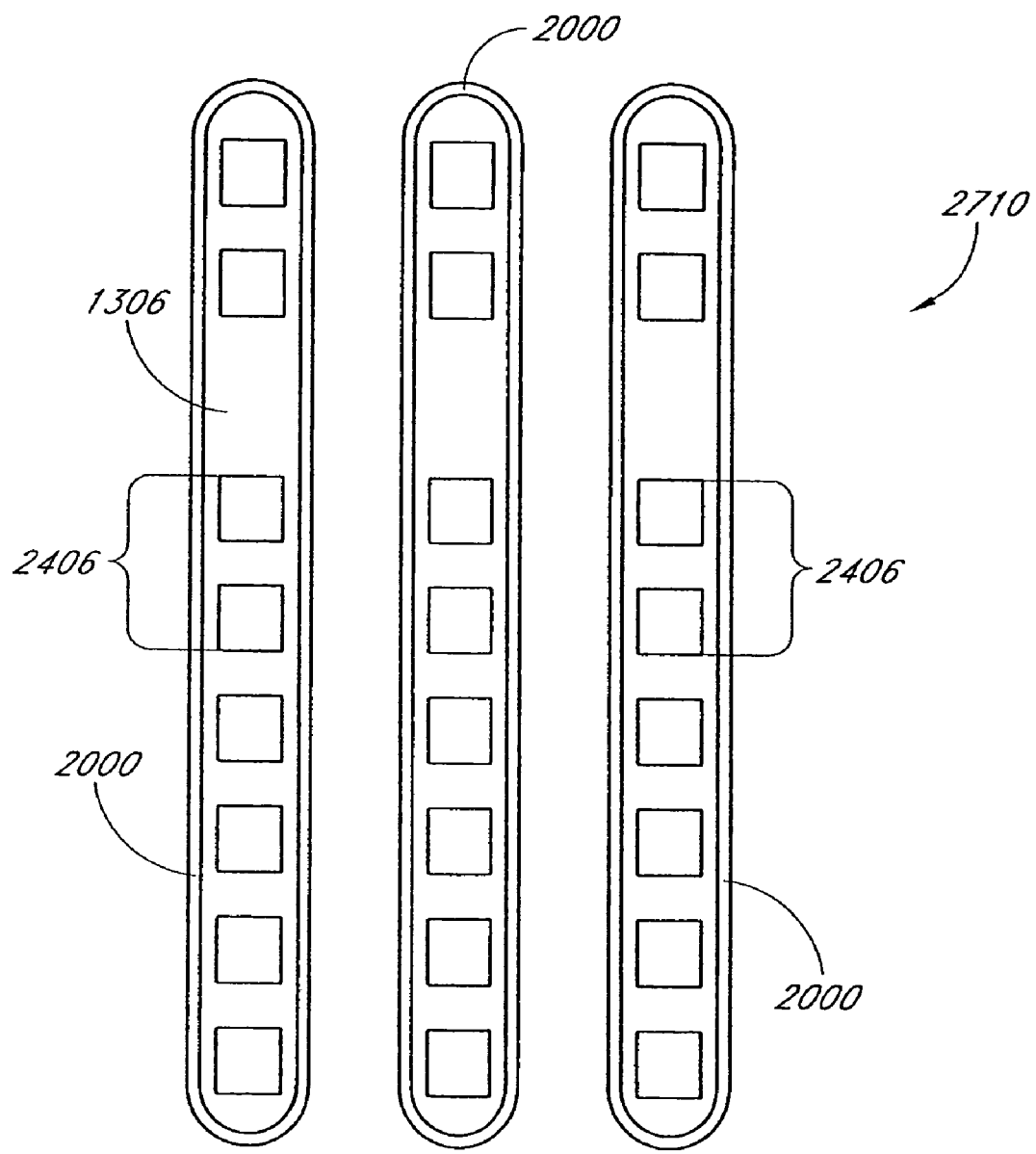
FIG. 30 is a schematic top plan view of a portion of a memory array illustrating an embodiment of a wordline for use with the preferred embodiments.

FIG. 30 illustrates a portion of a memory array 2710 comprising a plurality of wordlines 2000. The wordline 2000 at least partially surrounds the column of U-shaped transistor protrusions 2406. The contact trench 1306 along columns of the U-shaped transistor protrusions 2406 in the device 100 provides room for a wordline contact from above.

Figure 31:
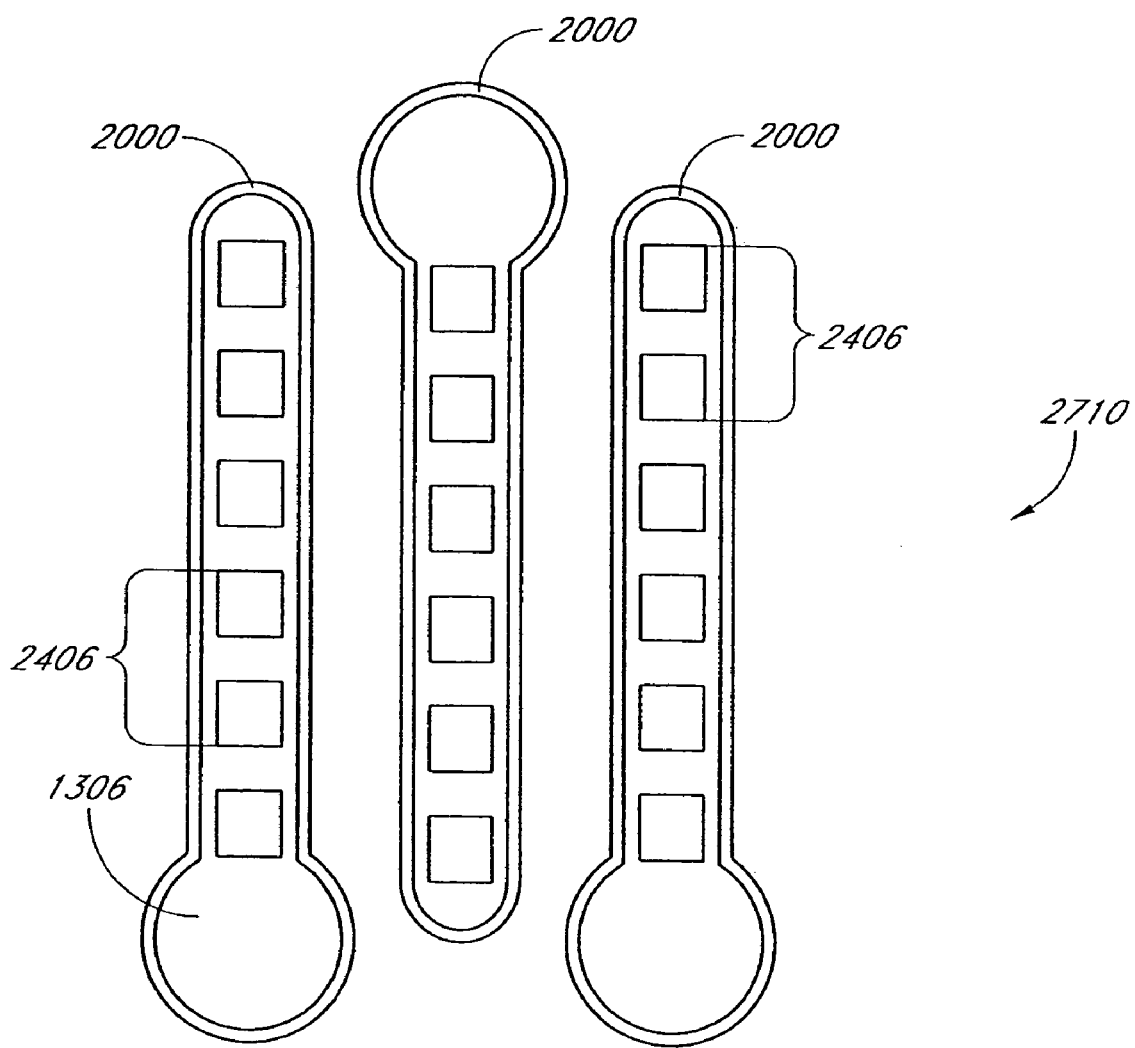
FIG. 31 is a schematic top plan view of a portion of a memory array illustrating another embodiment of a wordline for use with the preferred embodiments.

FIG. 31 illustrates another embodiment of the portion of the memory array 2710 employing the wordlines 2000. Contacts for the wordlines 2000 are placed at the alternating ends of the columns of transistors. In this embodiment, the wordlines 2000 are patterned for higher integration within the memory array 2710.

FIGS. 32-35 illustrate another embodiment of a portion of a memory array 2710 comprising wordlines 3200. The memory array 2710 further comprises a plurality of three-sided transistors 3202. Each transistor 3202 comprises two silicon pillars 1802 formed as described above with respect to FIGS. 1-14. The first or shallow trench 800, however, is filled with a nitride-containing material, such as silicon nitride. The wordline trench 1800 is formed as described with respect to FIGS. 16-18.

Before forming the gate dielectric 1902 and depositing the gate layer 1904 in the wordline trench 1800, as illustrated in FIG. 19, a selective nitride etch removes the nitride (see FIG. 14) from the shallow trench 800.

After the selective nitride etch removes the nitride from the shallow trench 800, the gate dielectric 1902 is formed, and the gate layer 1904 is deposited in the wordline trench 1800, as illustrated in FIG. 19. The gate dielectric 1902 also forms in the shallow trench 800. Further, the gate layer 1904 is also deposited in the shallow trench 800. Because the shallow trench 800 is narrower than the wordline trench 1800, the deposition of the gate layer 1904 fills the shallow trench 800.

The spacer etch of the gate layer 1904, illustrated in FIG. 20, recesses the gate layer 1904 deposited in the shallow trench 800, but does not remove the gate layer 1904 in the shallow trench 800.

The process continues as described in FIGS. 21-23. The device 100 is reoxidized and spacers 2102 are formed (FIG. 21), the conductive layer 2200 is formed (FIG. 22), and the device 100 is planarized (FIG. 23).

Figure 32:
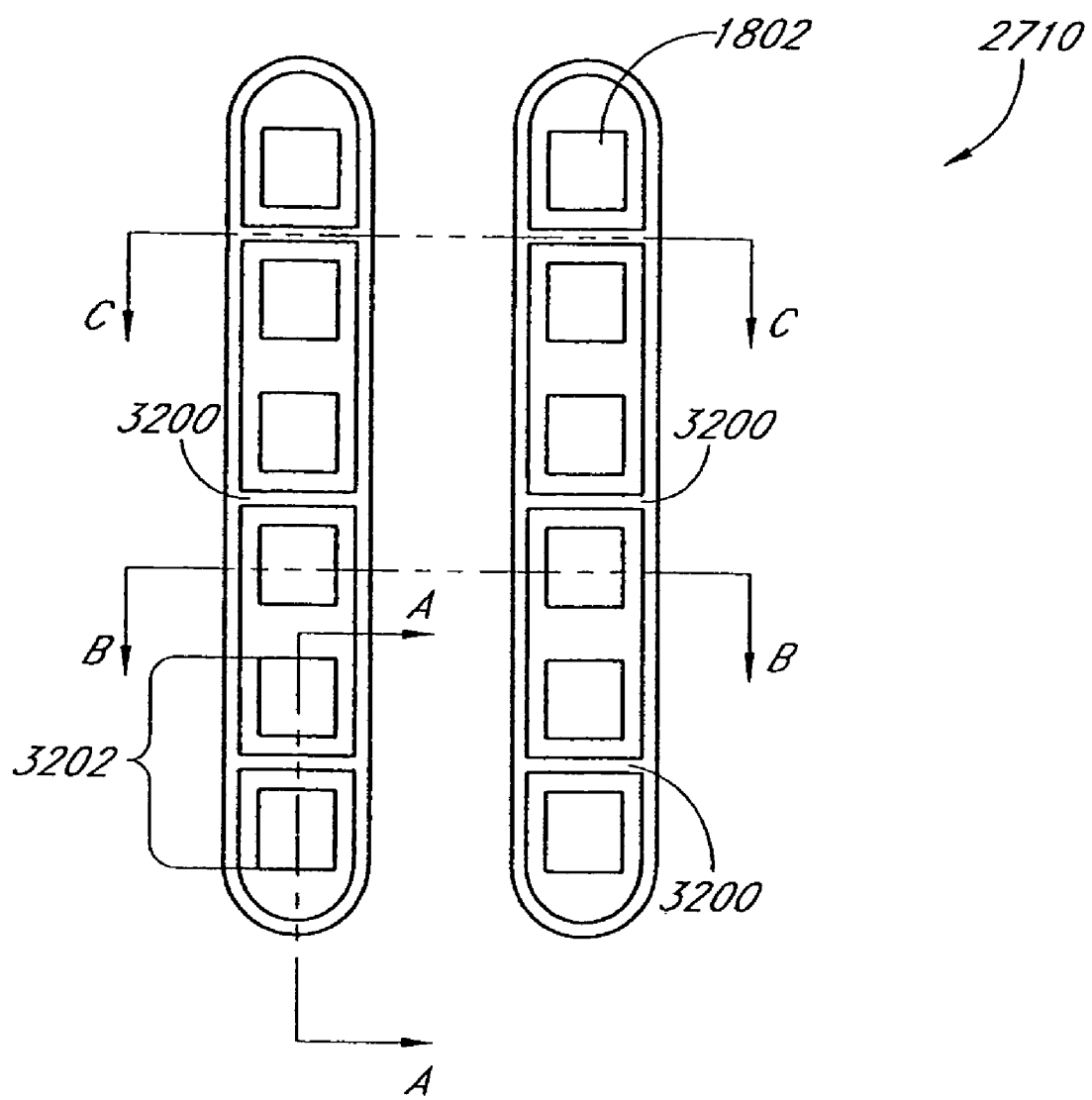
FIG. 32 is a schematic top plan of a portion of a memory array illustrating another embodiment of a wordline.

Referring to FIG. 32, the wordline 3200 formed by the above process defines a ladder-shaped polysilicon gate layer 3200. The transistors 3202 are surrounded on three sides by the ladder-shaped gate layer 3200, forming the three-sided surround gate transistors 3202.

Figure 33:
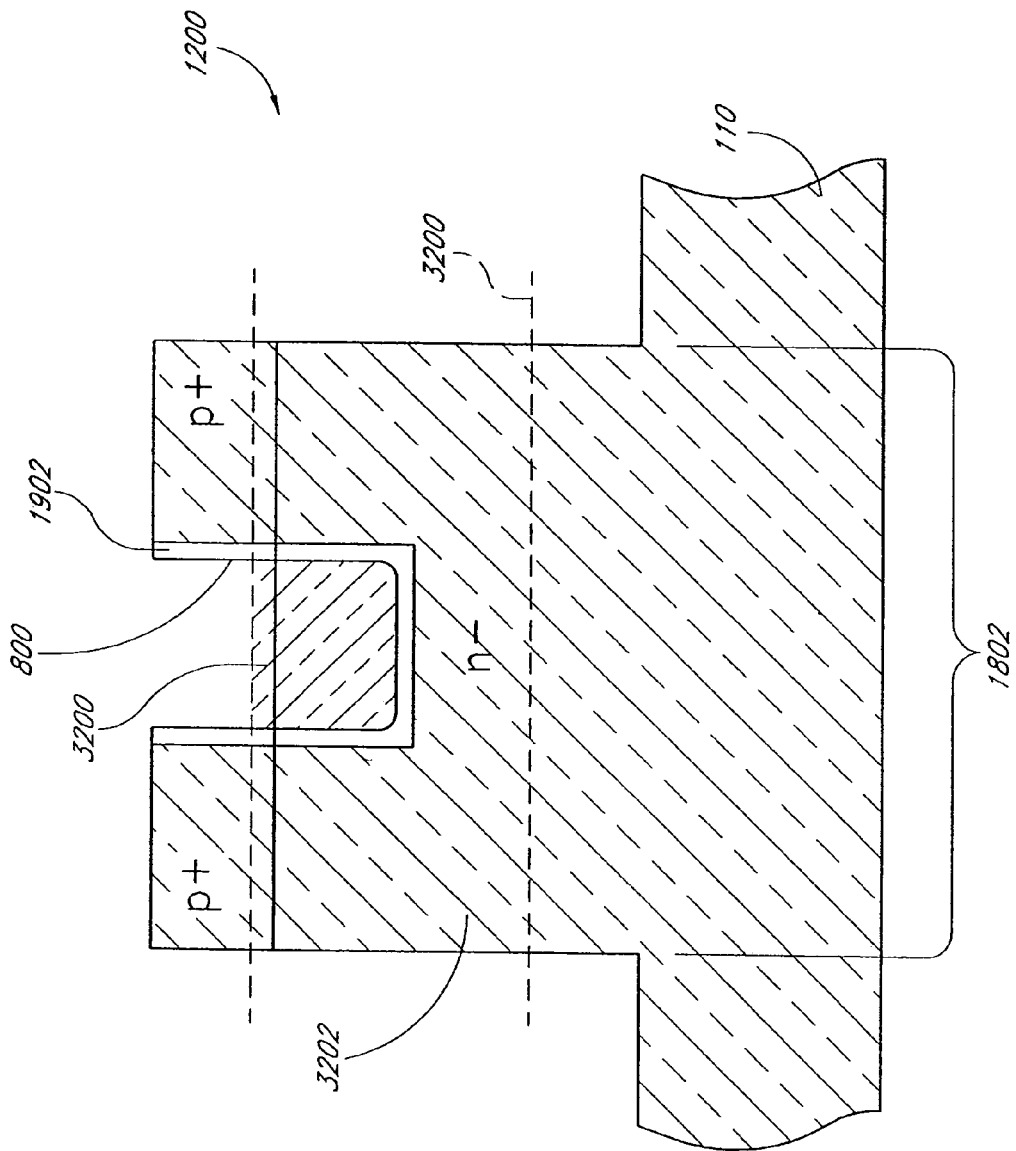
FIG. 33 illustrates a cross-sectional view, taken along line A-A of FIG. 32, of a three-sided transistor.

FIG. 33 illustrates a cross-section of the U-shaped transistor 3202 as viewed from the plane formed by line A-A of FIG. 32. The device 100 comprises the pair of silicon pillars 1802, the oxide-filled deep trench 1200, the shallow trench 800, and the substrate 110. The shallow trench 800 comprises the dielectric layer 1902, and is filled with the gate layer 3200. The sections of the gate layer 3200 that are parallel to the plane of view are indicated by dashed lines. Pairs of pillars 1802 form the transistors 3202. Each pillar 1802 in the pair of pillars 1802 is separated from the other pillar 1802 in the pair of pillars 1802 by the polysilicon-filled shallow trench 800. Each transistor 3202 is separated from another transistor 3202 by the oxide-filled deep trench 1200.

In the illustrated embodiment, each of pillars 1802 has a p+ doped source/drain region in an uppermost portion of the pillar. The transistor 3202 further comprises an n− doped region that extends from the p+ doped region of one pillar 1802 to the p+ doped region of the other pillar 1802. The wordline 3200 is indicated by dashed lines.

Figure 34:
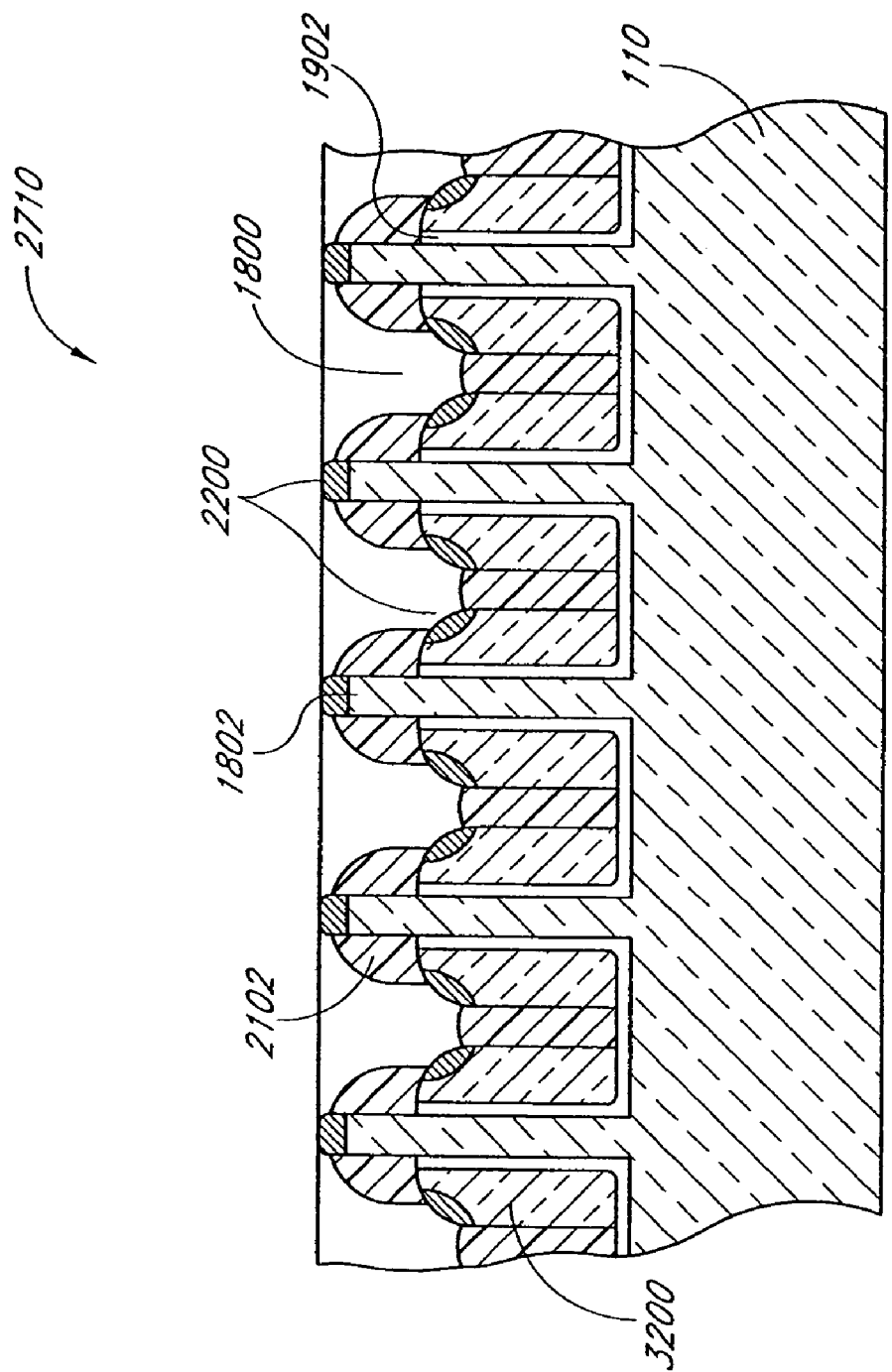
FIG. 34 illustrates a cross-sectional view taken along line B-B of FIG. 32.

FIG. 34 illustrates a cross-section of the memory array 2710 as viewed from the plane formed by the line B-B of FIG. 32. The memory array 2710 comprises silicon pillars 1802. The silicon pillars 1802 are separated from one another by the oxide-filled third trench 1800. The silicon pillars 1802 are preferably approximately 410 Å to 510 Å wide, and more preferably 440 Å to 480 Å wide. The memory array 2710 further comprises the gate dielectric 1902, the wordline 3200, and the conductive strapping layer 2200.

Figure 35:
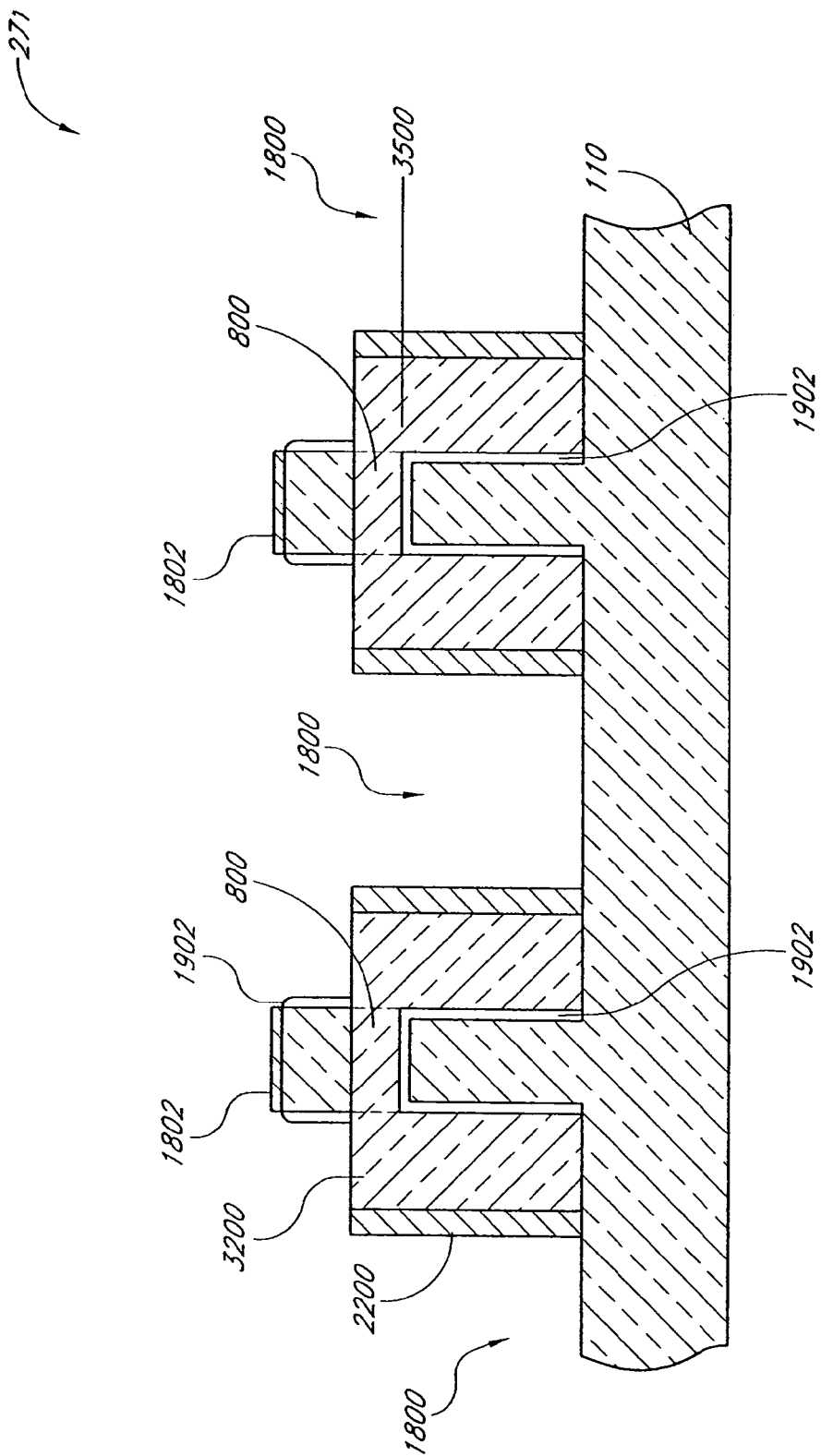
FIG. 35 is a cross-sectional view taken along line C-C of FIG. 32, showing an inverted U-shaped gate layer for a three-sided transistor.

FIG. 35 illustrates a cross-section of the memory array 2710 as viewed from the plane formed by line C-C of FIG. 32, shown without the conductive strapping layer for convenience. This view illustrates the (partially) polysilicon-filled shallow trench 800, which forms a "rung" of the ladder-shaped gate layer 3200. The bottom 3500 of the shallow trench 800 defines the lower edge of the "rung" of the ladder-shaped gate layer 3200. The memory array 2710 comprises the silicon pillars 1802. The silicon pillars 1802 are separated from one another by the oxide-filled third trench 1800. The oxide-filled third trench 1800 comprises the "sides" of the ladder-shaped gate layer 3200. The memory array 2710 further comprises the gate dielectric 1902, and the conductive strapping layer 2200.

Methodology of the invention can be used in numerous applications. For example, the invention can be utilized for forming one transistor, one-capacitor 4F2 DRAM cells. In particular embodiments, the invention can be considered to comprise vertical DRAM cell technology. One transistor pillar connects the cell storage device to a substrate, and another transistor pillar connects the digit line to the substrate. The self-aligned lateral transistor channel region connects vertical source/drain region pillars to one another. The cell can have low digit capacitance and low wordline resistance, Because the U-shaped transistor protrusions 2406 comprises two U-shaped surfaces that share a common source, drain, and gate, the cell can have redundancy against vertical axis problems.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

I claim:

1. A method for forming a transistor for an integrated circuit, the method comprising:
    etching a semiconductor substrate to form a U-shaped silicon pillar pair and etched regions surrounding the U-shaped silicon pillar pair, wherein the silicon pillar pair comprises a first pillar and a second pillar;
    forming a first source/drain region in the first pillar;
    forming a second source/drain region in the second pillar; and
    forming a gate line in at least a portion of the etched regions, wherein the gate line at least partially surrounds the first and second pillars, wherein the first source/drain region, the second source/drain region, and at least a portion of the gate line form a U-shaped transistor.

2. The method of claim 1 further comprising forming a dielectric layer on the U-shaped silicon pillar pair within at least a portion of the etched regions, wherein the dielectric layer at least partially surrounds the first and second pillars.

3. The method of claim 1 further comprising forming a metal layer on the gate line and performing a self-aligned salicide process on the metal layer.

4. The method of claim 1 further comprising filling at least a portion of the etched regions with an oxide-containing material.

5. A method for forming a semiconductor device, the method comprising:
    etching a first set of trenches to a first depth into a semiconductor substrate;
    etching a second set of trenches to a second depth into the semiconductor substrate, wherein the first set of trenches is substantially parallel to the second set of trenches, and wherein the first set of trenches and the second set of trenches are alternately spaced from one another within the semiconductor substrate;
    etching a third set of trenches to a third depth into the semiconductor substrate, wherein the third set of trenches is substantially orthogonal to the first set of trenches and to the second set of trenches;
    wherein the first, second, and third sets of trenches define an array of vertically extending pillars, wherein the array of vertically extending pillars comprises vertical source/drain regions, and wherein the third depth is greater than the first depth and less than the second depth; and
    forming a gate line within at least a portion of the third set of trenches, wherein the gate line and the vertical source/drain regions form a plurality of transistors in which pairs of the source/drain regions are connected to one another through a transistor channel.

6. The method of claim 5 further comprising filling at least a portion of the first set of trenches with an oxide-containing material.

7. The method of claim 5 further comprising filling at least a portion of the first set of trenches with a conductive gate material.

8. The method of claim 5 further comprising filling at least a portion of the second set of trenches with an oxide-containing material.

9. The method of claim 5, wherein the gate line comprises a gate electrode layer and a metallic layer.

10. The method of claim 9, wherein the metallic layer comprises a metal silicide.

11. The method of claim 5, wherein each of the transistors comprises a first source/drain region electrically connected to a digit line and a second source/drain region electrically connected to a memory storage device.

12. The method of claim 5, wherein the first set of trenches and the second set of trenches are etched prior to etching the third set of trenches.

13. A method for forming a memory array, the method comprising:
    applying a device mask to a semiconductor substrate to form a first pattern of alternating first lines and first gaps on the semiconductor substrate;
    processing the semiconductor substrate to form a first set of trenches, wherein the first set of trenches are formed within the semiconductor substrate within at least a portion of the area defined by the first gaps;
    applying a periphery mask to the semiconductor device after forming the first set of trenches, wherein the periphery mask protects a periphery adjacent an array region;
    processing the semiconductor substrate to form a second set of trenches substantially parallel to the first set of trenches, wherein the second set of trenches are formed within the semiconductor substrate within at least a portion of the array region;
    applying a wordline mask to the semiconductor device to form a second pattern of alternating second lines and second gaps on the semiconductor substrate after forming the second set of trenches, wherein the second lines and second gaps intersect with paths of the first lines and first gaps; and
    processing the semiconductor substrate to form a third set of trenches, wherein the third set of trenches are formed within the semiconductor substrate within at least a portion of the area defined by the second gaps, and not formed in the protected periphery.

14. The method of claim 13 further comprising forming an epitaxial silicon layer on the semiconductor substrate prior to applying the first mask.

15. The method of claim 13 further comprising forming an array of pillars within the semiconductor substrate within at least a portion of the area defined by the second lines.

16. The method of claim 15, wherein the pillars comprise vertical source/drain regions.

17. The method of claim 13 further comprising forming a gate line in at least a portion of the third set of trenches.

18. The method of claim 17, wherein pairs of pillars defined by the trenches form U-shaped transistors, wherein each pillar in the pair of pillars is separated by one trench of the first set of trenches, and wherein each U-shaped transistor is separated from an adjacent U-shaped transistor by one trench of the second set of trenches.

19. The method of claim 18, wherein each of the transistors comprises a first source/drain region and a second source/drain region at the tops of the pair of pillars.

20. The method of claim 19 further comprising:
electrically connecting a digit line to the first source/drain region of each of the transistors; and
electrically connecting a memory storage device to the second source/drain region of each of the transistors.

21. The method of claim 20, wherein the memory storage device is a capacitor.

22. The method of claim 18, wherein a column of the U-shaped transistors surrounded by the gate line in the trenches of the third set of trenches on either side of the column form a wordline.

23. A method of forming a semiconductor structure comprising:
etching a set of wordline trenches within a semiconductor substrate;
etching a set of deep trenches within a semiconductor substrate, the set of deep trenches crossing and creating a grid with the set of wordline trenches, wherein the deep trenches are deeper than the wordline trenches, and wherein the set of wordline trenches and the set of deep trenches define a plurality of protrusions within the semiconductor substrate;
defining a heavily doped region and a lightly doped region within each protrusion;
depositing gate material into the set of wordline trenches; and
spacer etching the gate material to define a gate electrode on sidewalls of the protrusion.

24. The method of claim 23, wherein the gate electrode is only formed on opposite sidewalls of the protrusion.

25. The method of claim 23 further comprising etching a shallow trench into each protrusion to form a U-shaped protrusion comprising a first pillar, a second pillar, and a base, wherein the shallow trench is substantially parallel to the set of deep trenches.

26. The method of claim 25, wherein the heavily doped region forms source/drain regions at the tops of the pillars and the lightly doped region forms a U-shaped channel extending from lower parts of the pillars and across the base.

27. The method of claim 25, wherein defining doped regions comprises doping the semiconductor substrate prior to etching.

* * * * *